(12) United States Patent
Chan

(10) Patent No.: US 9,052,085 B2
(45) Date of Patent: Jun. 9, 2015

(54) LIGHT-EMITTING DIODE PANELS AND DISPLAYS WITH LIGHT BAFFLES AND METHODS AND USES THEREOF

(71) Applicants: Lighthouse Technologies Limited, Shatin (HK); Lighthouse Technologies (Huizhou) Limited, Huizhou (CN)

(72) Inventor: Curie Kui Lai Chan, Hong Kong (CN)

(73) Assignees: Lighthouse Technologies Limited, Shatin, N.T. (HK); Lighthouse Technologies (Huizhou) Limited, Huizhou (CN)

( * ) Notice: Subject to any disclaimer, the term of this patent is extended or adjusted under 35 U.S.C. 154(b) by 164 days.

(21) Appl. No.: 13/801,568

(22) Filed: Mar. 13, 2013

(65) Prior Publication Data

US 2014/0268738 A1    Sep. 18, 2014

(51) Int. Cl.
 F21V 7/00       (2006.01)
 F21V 17/10      (2006.01)
 F21V 33/00      (2006.01)
 H01L 27/15      (2006.01)
 G02F 1/1335     (2006.01)

(52) U.S. Cl.
CPC ............. *F21V 7/0083* (2013.01); *F21V 17/10* (2013.01); *F21V 33/0052* (2013.01); *Y10T 29/49826* (2015.01); *G02F 2201/465* (2013.01); *G02F 1/133605* (2013.01); *H01L 27/156* (2013.01)

(58) Field of Classification Search
CPC ....... F21V 7/0083; F21V 17/00; F21V 17/10; F21V 33/0052; G02F 2201/465; G02F 1/133605
USPC ................ 362/290–293, 433, 348, 342, 354, 362/97.1–97.4, 297, 346, 217.03, 247, 362/238–245, 217.01–217.17, 147–150; 345/39; 277/637; 40/554
See application file for complete search history.

(56) References Cited

U.S. PATENT DOCUMENTS

| | | | | |
|---|---|---|---|---|
| 5,704,708 A | * | 1/1998 | Barson et al. | 362/238 |
| 5,949,581 A | * | 9/1999 | Kurtenbach et al. | 359/621 |
| 8,350,788 B1 | * | 1/2013 | Nearman et al. | 345/83 |
| 2007/0103908 A1 | * | 5/2007 | Tabito et al. | 362/294 |
| 2011/0317095 A1 | * | 12/2011 | Shimizu | 349/62 |

FOREIGN PATENT DOCUMENTS

EP         1645800 A2   *  4/2006

* cited by examiner

*Primary Examiner* — Anh Mai
*Assistant Examiner* — Arman B Fallahkhair
(74) *Attorney, Agent, or Firm* — Schiff Hardin LLP

(57) ABSTRACT

An LED video display includes an array of LED elements mounted on an LED panel. A light baffle has openings to accept the LED elements, and reflectors are formed about each LED opening. A shader or rib is provided above each LED reflector in the light baffle. A second rib is provided below each LED reflector to form a rib pair between adjacent LED reflectors. Mounting openings in the light baffle are in place of the rib pair that would otherwise be present in the arrangement of ribs. A mounting clip having a rib pair is fastened to the LED panel. The rib pairs of the mounting clips are inserted through the mounting openings in the light baffle to secure the light baffle and LED panel to one another. The rib pairs of the clips align with the rib pairs of the light baffle.

19 Claims, 21 Drawing Sheets

LIGHT-EMITTING DIODE PANELS AND DISPLAYS WITH LIGHT BAFFLES AND METHODS AND USES THEREOF

FIELD OF THE INVENTION

The present invention relates generally to a light baffle for a display, and more particularly to a light baffle or louver for an LED display panel.

BACKGROUND OF THE INVENTION

LED (Light Emitting Diode) panels are used in signs and displays to provide video displays such as large video displays at sports venues, shopping malls, airports, entertainment venues, and the like. The video displays may be provided indoors such as in arenas, outdoors such as in stadiums, or on billboards along roadways. The video displays may display video images or still images.

The video display provided as a large display panel in a sports or entertainment venue should be viewable by viewers over a wide area of the audience and should provide a display of uniform brightness and seamless appearance to each viewer. The video display is formed by an arrangement of smaller LED panels mounted adjacent on another. An LED panel used in the video display includes an array of LED elements that are each provided with a reflector to increase the apparent size of each LED to the viewer and thereby improve the appearance of the display. The light baffle panels are affixed by screws to a printed circuit board assembly or other mounting panel on which the LED elements are mounted.

The screws that affix the light baffle to the printed circuit board assembly may be visible to the viewer. Depending on the orientation of the mounting screws, the user may be able to see either the heads of the mounting screws or the tips of the mounting screws. The mounting screws also interrupt the regular structure of the light baffle element. Thus, the screws affect the visual performance of the video display. The presence of mounting structures that are visible to the viewer detract from the appearance of the display, particularly if the viewer is able to discern the structure of the display rather than viewing the display as a seamless image.

BRIEF SUMMARY OF THE INVENTION

The present invention provides a mounting method and apparatus for affixing a light baffle to an LED panel. The mounting method and apparatus provides mounting clips that appear from the front of the video display as elements of the light baffle. The light baffle panel includes a regular array of light directing structures, and the mounting clips form one of more such light directing structures in the regular array of the light baffle. The mounting clips are preferably indistinguishable from the structural elements of the light baffle to the viewer of the video display.

In preferred embodiments, the light baffle panel includes a regular array of reflectors for the LED elements and a regular arrangement of light directing ribs or louvers that serve as shaders for the LED elements. The shaders shield the LED elements and their reflectors from direct overhead light, so that sunlight or bright overhead lighting does not wash out the appearance of the display. Several such ribs or shaders are absent from the regular arrangement on the light baffle panel, and openings are provided in the baffle panel in place of the absent ribs. The mounting clips which fasten the light baffle panel to the LED panel extend through the openings and include the missing rib or shader structures. The rib structures of the mounting clips are configured to match the rib structures in the arrangement of ribs on the light baffle panel.

The mounting clips are fastened to the LED panel on which the array of LED elements is provided. The light baffle panel is fastened to the LED panel by passing the clips through the openings in the baffle panel. When fastened to the LED panel with the mounting clips, the ribs on the mounting clips complete the regular arrangement of ribs on the light baffle panel. The resulting assembly contains no fasteners that are apparent to the viewer.

A plurality of the assembled LED and light baffle panels is provided to form a large format video display. The image on the display is improved by the lack of visible fasteners for securing the light baffle panels to the LED panels.

In accordance with an aspect of the present invention, an LED video panel, comprising at least one LED panel including a plurality of LED elements; a light baffle panel defining a plurality of LED openings for receiving the LED elements of the at least one LED panel, the light baffle including reflectors at the LED openings, at least one light deflecting rib at the reflectors, the light baffle defining a plurality of mounting openings; and a plurality of mounting clips including a first portion affixed to the at least one LED panel and a second portion including at least one light deflecting rib, the at least one light deflecting rib extending through a respective one of the mounting openings of the light baffle to fasten the light baffle to the LED panel.

In another aspect, the light baffle includes a pair of ribs disposed between adjacent ones of the reflectors.

In another aspect, the mounting clips each include a pair of ribs for insertion through respective ones of the mounting openings.

In another aspect, the mounting clips each define a slot formed between the ribs of the pair of ribs to permit the ribs of the pair of ribs to flex toward one another during insertion into the mounting opening in the light baffle.

In another aspect, the pair of ribs of the light baffle includes a tall rib and a short rib disposed adjacent to and in parallel to one another.

In another aspect, the mounting clips each include a pair of ribs comprising a tall rib and a short rib, the pair of ribs of the mounting clips matching the pair of ribs of the light baffle when the mounting clips are fastened in the mounting openings of the light baffle.

In another aspect, the mounting openings in the light baffle includes a beveled outer portion of the mounting openings; and wherein the mounting clips include a pair of ribs having beveled mounting portions disposed at the beveled outer portions of the mounting portions of the mounting openings when the mounting clips are fastened in the mounting openings.

In another aspect, the mounting clips each include a base bar and at least one mounting peg extending from the base bar, the at least one mounting peg being fastened to the LED panel.

In another aspect, the base bar of each mounting clip includes two mounting pegs, the mounting pegs each including a catch nose for engagement with the LED panel.

In another aspect, the reflectors include a plurality of ridged surfaces arranged about respective ones of the LED openings in the light baffle.

In another aspect, the reflectors include a plurality of smooth surfaces arranged about respective ones of the LED openings in the light baffle.

In another aspect, the LED panel includes an array of LED elements disposed in rows and columns, wherein the light baffle includes the LED openings and the reflectors and the light deflecting ribs arranged in an array of rows and columns; wherein the mounting openings in the light baffle are disposed in place of selected ones of the light deflecting ribs in the rows and columns of light deflecting ribs; and wherein the mounting clips include light deflecting ribs that are disposed in place of the selected light deflecting ribs in the rows and columns of light deflecting ribs when mounted in the mounting openings of the light baffle.

In another aspect, the rows of light deflecting ribs include rows of rib pairs; and wherein the mounting clips include rib pairs that are disposed in place of the selected rib pairs in the rows of rib pairs.

In accordance with a second aspect of the present invention, a method of mounting a light baffle to an LED panel, comprising the steps of fastening a mounting clip to an LED panel having a plurality of LED elements disposed in an array, the mounting clip including at least one light deflecting rib extending perpendicular to the LED panel; and inserting the at least one light deflecting rib of the mounting clip through a mounting opening in a light baffle, the light baffle including LED openings disposed to receive the plurality of LED elements of the LED panel, the light baffle including a plurality of light deflecting ribs in a regular arrangement, the at least one light deflecting rib of the mounting clip being positioned in the regular arrangement of the light deflecting ribs of the light baffle when the mounting clip is fastened in the mounting opening of the light baffle.

In another aspect, the step of inserting the at least one light deflecting rib of the mounting clip through the mounting opening include inserting a pair of light deflecting ribs through the mounting opening.

In another aspect, the step of inserting the pair of light deflecting ribs through the mounting opening includes flexing the ribs of the pair of ribs toward one another during the inserting step.

In another aspect, the step of inserting the at least one light deflecting rib of the mounting clip through the mounting opening includes seating a beveled portion of the rib of the mounting clip at a beveled portion of the mounting opening of the light baffle.

In another aspect, the step of fastening the mounting clip to the LED panel includes inserting at least one mounting peg of the mounting clip into a mounting opening in the LED panel.

In accordance with a third aspect of the present invention, a video display, comprising a light emitting element panel; a plurality of light emitting elements disposed in an array on the light emitting element panel; a plurality of clips affixed to the light emitting element panel, each of the clips including a base mounted to the light emitting element panel and pair of light directing ribs extending from the base, the light directing ribs being affixed to the base so as to flex toward one another, the ribs each having a beveled lower outer surface; a light baffle defining an array of openings for receiving the array of the light emitting elements, reflector structures formed in the light baffle at each of the openings for receiving the light emitting elements, first and second light deflecting ribs disposed on opposite sides of the reflector structures, ones of the light deflecting ribs forming pairs of light deflecting ribs between adjacent reflector structures, the light baffle defining a plurality of mounting openings through the light baffle, the mounting openings including beveled portions of the mounting openings; wherein the pair of light deflecting ribs of the mounting clips extends through respective ones of the mounting openings in the light baffle, the beveled lower outer surfaces of the ribs being disposed at the beveled portions of the mounting openings, so that the light baffle is affixed to the light emitting element panel by the mounting clips.

BRIEF DESCRIPTION OF THE DRAWINGS

The figures are for illustration purposes only and are not necessarily drawn to scale. The invention itself, however, may best be understood by reference to the detailed description which follows when taken in conjunction with the accompanying drawings in which.

DETAILED DESCRIPTION OF THE INVENTION

Figure 1:
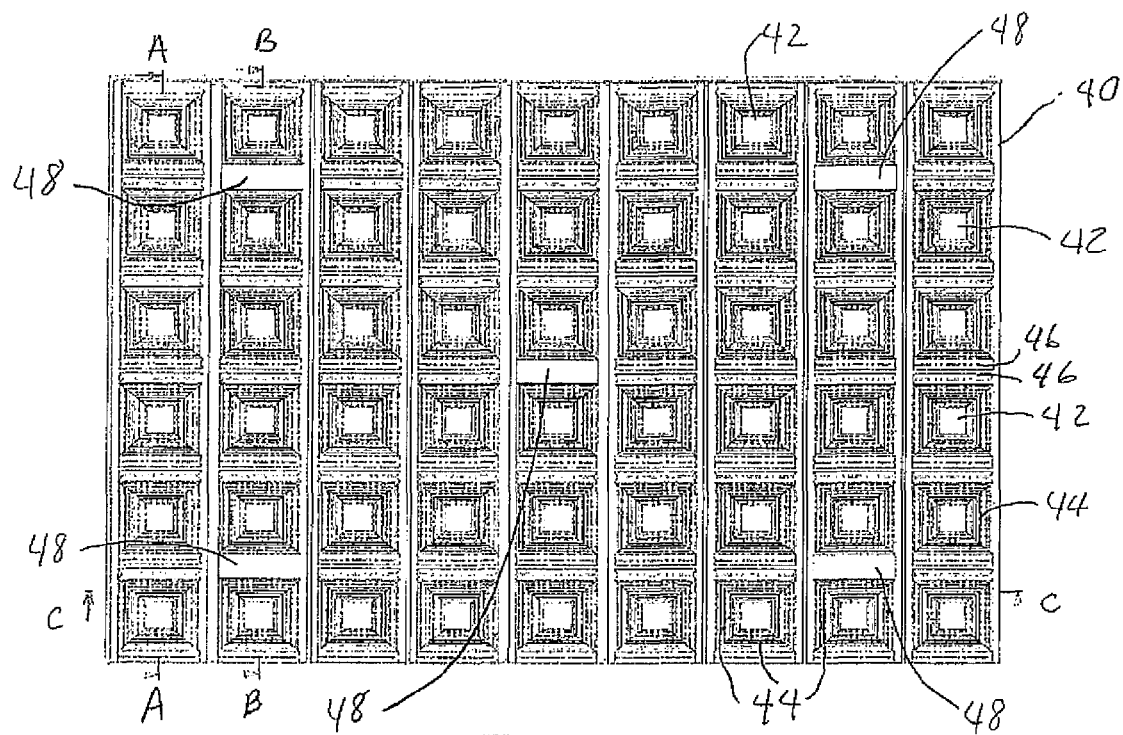
FIG. 1 is a top plan view of a first embodiment of a light baffle panel for use with an LED light array according to the principles of the invention.

Referring first to FIG. 1, a light baffle 40 is provided for an array of LED light elements. The illustrated light baffle or louver 40 includes a regular arrangement of openings 42 that are to be mounted over corresponding LED elements. The illustrated baffle is for a 9×6 array of LED elements. Adjacent each of the openings 42 of the light baffle are provided a stepped or terraced light reflecting structure 44 that extends on four sides of the LED opening 42. The light reflecting structure 44 distributes and directs the light emitted from the LED elements, resulting in the LED elements appearing larger to the viewer. This increases the apparent size of the pixels in the displayed video image.

The stepped or terraced reflectors 44 are configured to provide a square or rectangular reflector element at each LED opening 42. It is of course possible to provide other shapes of reflectors, such as circular, oval or other shapes.

Figure 2:
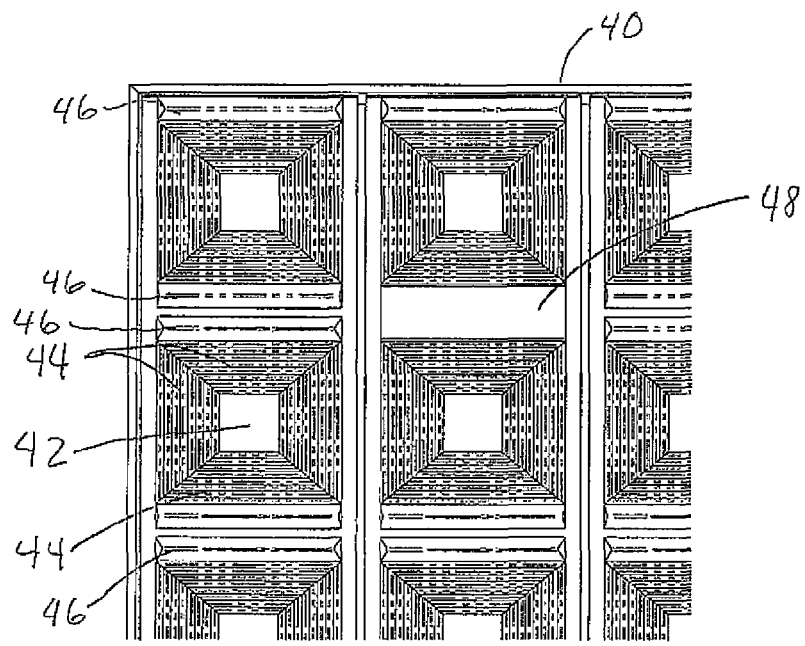
FIG. 2 is an enlarged view of a corner portion of the light baffle of FIG. 1.

An enlarged view of a portion of the light baffle 40 is shown in FIG. 2 wherein the stepped or terraced reflectors 44 can be more easily seen.

On two opposing sides of each square or rectangular reflector element 44 is provided a light directing rib or shader 46. In the illustration of FIGS. 1 and 2, one rib 46 is disposed above each reflector element 44 and one rib 46 is disposed below each reflecting element 44, although the position and orientation of the ribs may differ depending upon the application in which the LED panel will be used or for other reasons. Where reflecting elements are adjacent one another in a vertical direction, the lower rib 46 of one reflecting element is disposed adjacent the upper rib 46 of the other reflecting element, forming a rib pair.

At a plurality of locations in the light baffle, openings 48 are provided for mounting the baffle. The mounting openings 48 are disposed where two adjoining light directing ribs would be located in the regular array of light directing ribs 46. In the illustrated embodiment, five such mounting openings 48 are provided, one spaced inwardly from each of the four corners of the rectangular light baffle 40 and a fifth mounting opening 48 at the center of the light baffle. The enlarged view of FIG. 2 includes one such mounting opening 48—which is in place of one rib pair.

Figure 3:
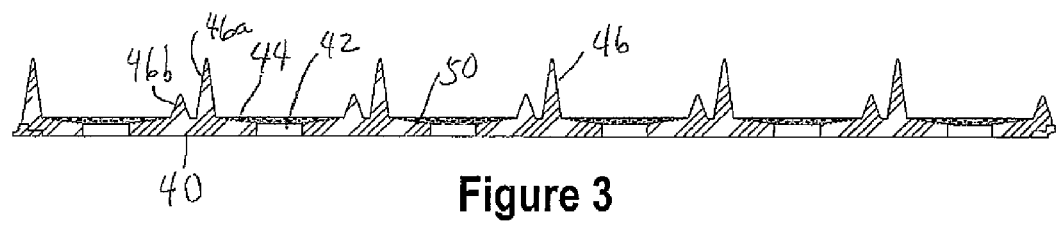
FIG. 3 is a cross sectional view of the light baffle along line A-A of FIG. 1.
Figure 4:
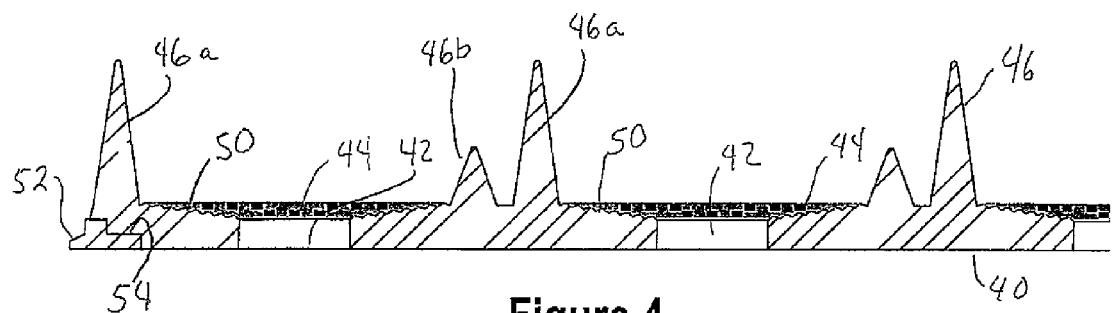
FIG. 4 is an enlarged view of an end of the cross sectional view of FIG. 3.

FIG. 3 shows a cross section through the center of a column of the LED reflectors 44 of the light baffle 40. FIG. 4 shows an enlarged view along the same cross section line for a better view of the details. Each reflector element 44 includes a central opening 42 at which an LED element is positioned. The surface of the reflector 44 adjoining the central opening 42 is provided shaped with a stepped or terraced surface 50 angled extending outward from the central opening 42. The stepped or terraced surface 50 may be formed with a pattern of undulations, angles, or shapes to provide light dispersion from the LED element at the center of the reflector. The pattern of undulations, angles, or shapes may form a grating or other light directing or reflecting structure. The surface of the reflector may be coated with a reflective coating or a partially reflective coating, or may be coated with multiple layers of coating materials for light selective reflection and/or transmission. The material of the light baffle 40 may be transparent, translucent or opaque. The light baffle 40 may be made of a plastic or polymer or other material. In one example, the light baffle is of polycarbonate and is formed in a double injection process. In a preferred embodiment, the baffle elements 40 and 46 have no additional coating but are the color of the plastic material of which they are formed.

At the outer-most extent of the stepped or terraced portion 50 are a pair of the light directing ribs or shaders 46. The light directing ribs 46 of the preferred embodiment are provided on opposing sides of each reflector element 44 in one orthogonal direction, but are not provided for the reflecting elements in the other orthogonal direction. The arrangement of the ribs can differ in other embodiments. Relative to the orientation of FIGS. 3 and 4, the light directing rib 46 to the left of each LED opening is taller 46a and the light directing rib to the right of each LED opening is shorter 46b. The baffle panel 40 is preferably mounted so that overhead lighting or sunlight strikes the taller rib 46a so that the taller rib shades the LED element and the reflector 44 from direct light. The combination of tall and short ribs 46a and 46b provides an improved directionality to the viewing angle of the LED array, so that viewers below the LED display may more readily view the image on the display. The shorter rib 46b is provided to increase contrast in the display, which is accomplished by minimizing flat surfaces in the display structure. In a preferred embodiment, the light from the LED panel is emitted with a +/−70 degree horizontal viewing angle and a +/−50 degree vertical viewing angle. In one example, the display panel forms an SMD 3-in-1, full color, waterproof display using SMD LEDs.

The combination of tall and short ribs 46a and 46b also results in a tall rib 46a and short rib 46b being adjacent one another as a rib pair at adjoining LED reflector elements 44. The light directing ribs 46 may be coated with a reflecting material, light absorbing material, or a partially reflecting layer, and may be formed of a transparent, translucent or opaque material.

As more clearly seen in the enlarged view of FIG. 4, a frame 52 is provided at the outermost extent of the light baffle panel 40, the frame 52 including a recess 54 within which the light baffle 40 is mounted and the baffle panel being shaped to be received into the frame 52.

Figure 5:
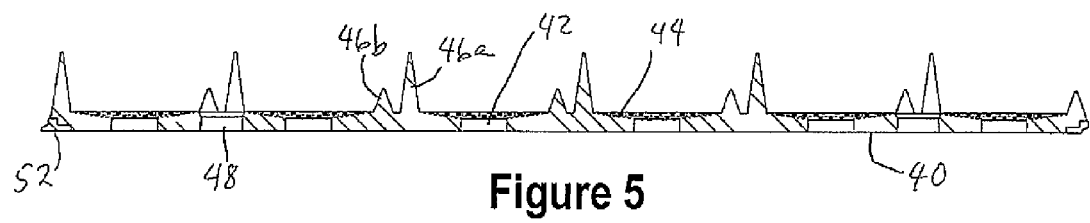
FIG. 5 is a cross sectional view of the light baffle along line B-B of FIG. 1.
Figure 6:
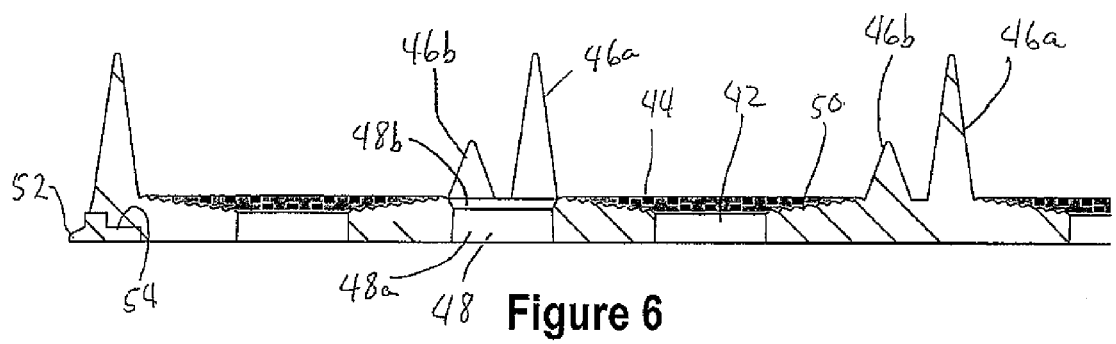
FIG. 6 is an enlarged view of an end of the cross sectional view of FIG. 5.

FIG. 5, and the enlarged view of FIG. 6, show a cross section through the light baffle 40 at a line taken through the mounting openings 48. The LED openings 42 and stepped or terraced reflector structures 44 are provided in the regular array with paired tall and short ribs 46a and 46b at adjoining reflector elements, but the paired tall and short ribs of the light baffle are missing at each of the mounting openings 48. At the mounting opening, the short and tall ribs 46b and 46a of the next adjacent reflector element are seen in end view. The each mounting opening 48 includes a main through portion 48a and a beveled outer portion 48b of the opening. The main through portion 48a of a preferred embodiment is slightly angled to be wider at the back of the baffle panel. In one embodiment, the opening 48a includes walls angled inwardly at 5 degrees from perpendicular. The beveled outer portion 48b of the opening is at a significantly steeper angle from perpendicular. In one embodiment, the angle of the bevel is 57 degrees from perpendicular.

Figure 7:
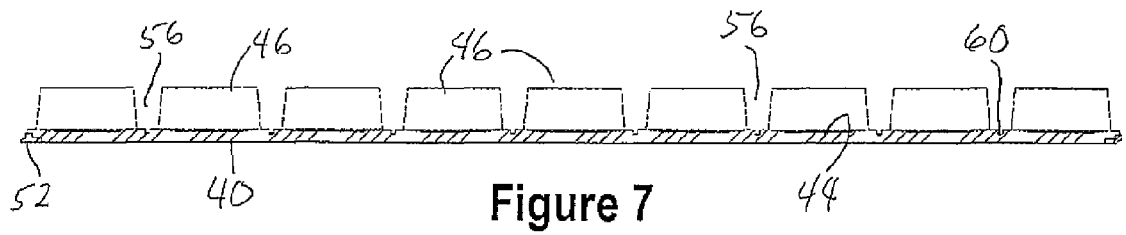
FIG. 7 is a cross sectional view of the light baffle along line C-C of FIG. 1.
Figure 8:
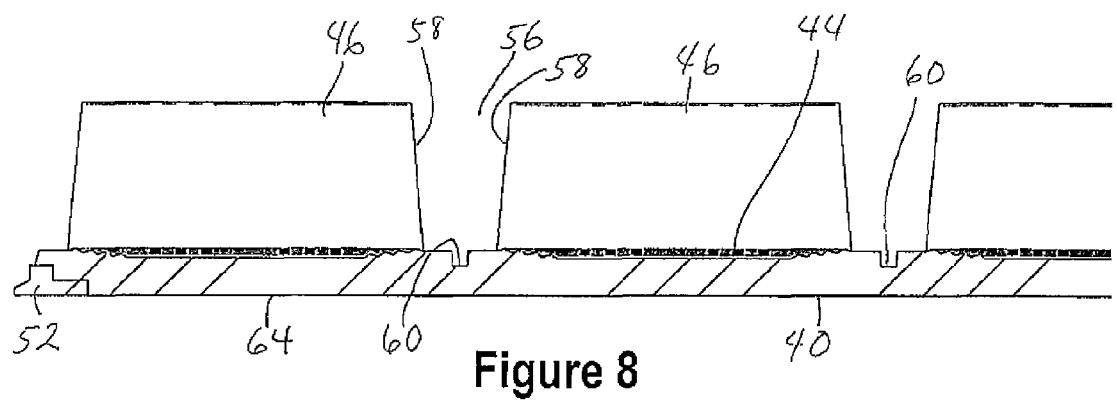
FIG. 8 is an enlarged view of an end of the cross sectional view of FIG. 7.

FIG. 7 shows the light directing ribs or shaders 46 that extend from the light baffle 40 at each LED reflector element 44, seen looking in a direction perpendicular to the length of the ribs. The ribs or shaders 46 of adjoining reflector elements 44 are spaced apart from one another by a gap 56. In a preferred embodiment, the ends 58 of the ribs 46 are angled so as to be wider at the base and narrower at the free end. An enlarged view is shown in FIG. 8, wherein the each rib 46 is aligned with and centered with respect to the stepped or terraced structure 44 of the corresponding reflector element. A generally rectangular notch 60 is formed into the baffle panel body 40 between each rib 46. The notch 60 is of a size and shape to appear similar to a seam between adjoining panels so that the seams are not apparent to the viewer. The shape and size of the notch 60 differs depending on tolerances in the product. The illustrated ribs 46 are the tall ribs 46a in FIGS. 7 and 8.

Figure 9:
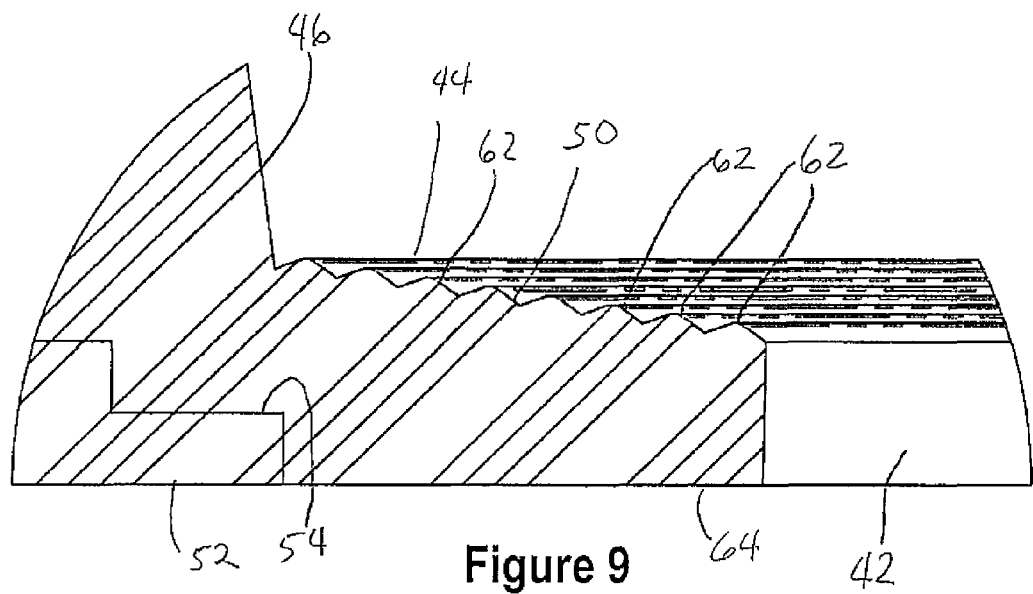
FIG. 9 is an enlarged cross sectional view of one half of an LED baffle element.

FIG. 9 provides an enlarged view of the shape of the stepped or terraced reflector surface 50 of a reflector 44. A regular arrangement of ridges 62 is provided in this embodiment, the ridges 62 rising at an increasing height from the back surface 64 of the baffle body the further each ridge 62 is spaced from the LED opening 42. The arrangement of ridges 62 provides a grating structure to spread and distribute light from the LED. In particular, light from the LED is caught by and reflected from the arrangement of ridges 62 to provide a larger apparent size for the LED. This results in larger pixels for the video display and a smoother appearance for the video image. The rib 46 which lies at the outermost extent of the reflector is cut off in this view, its full height not being shown relative to the ridge dimensions.

Figure 10:
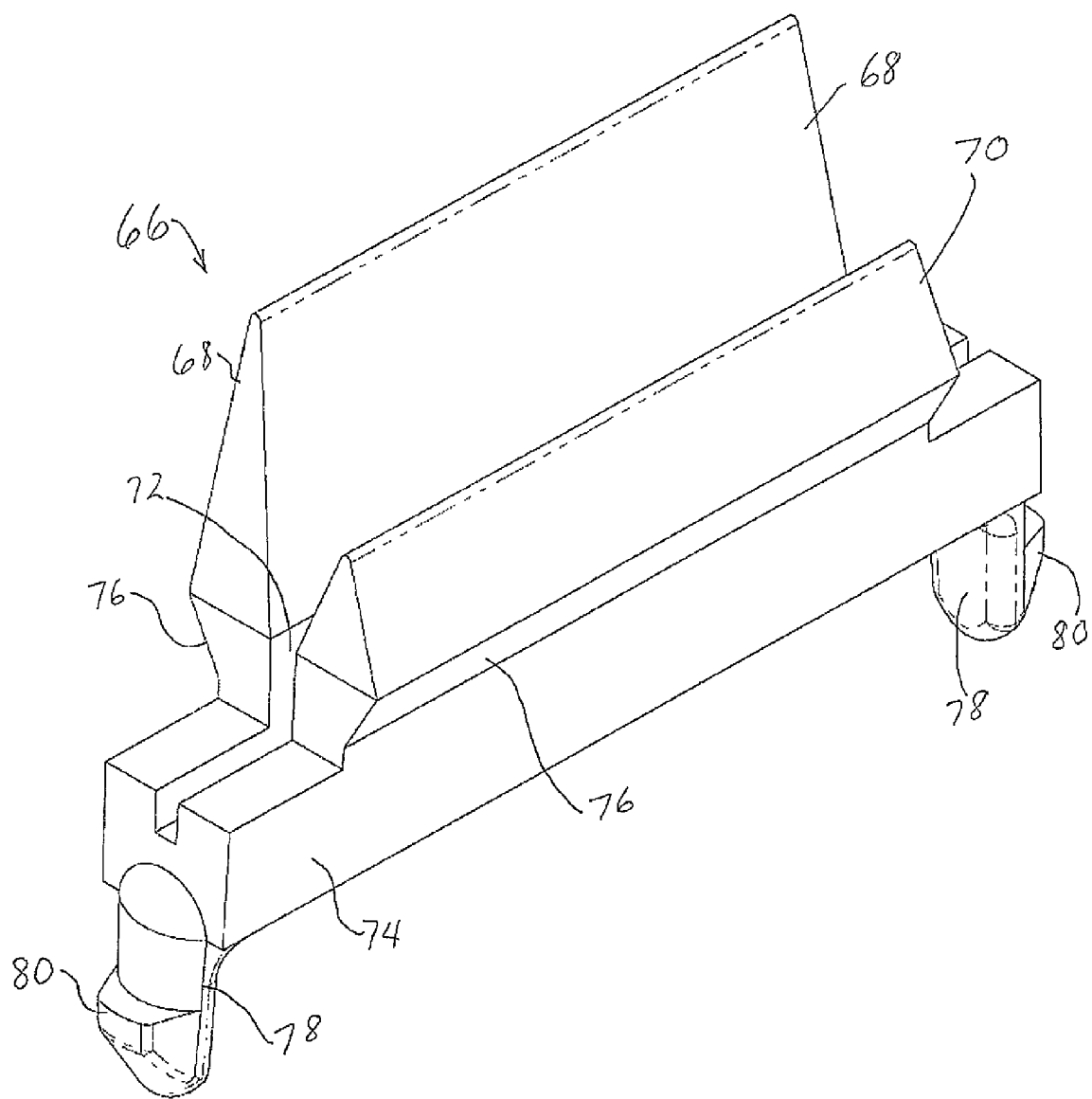
FIG. 10 is a perspective view of a clip for securing the baffle of FIG. 1 to a printed circuit board assembly.

FIG. 10 shows a clip element 66 for fastening the baffle panel of FIG. 1 to a printed circuit board assembly or other mounting location. The clip 66 includes a tall rib 68 and a short rib 70 disposed adjacent one another as a rib pair. The ribs 68 and 70 are formed with a slot 72 therebetween and are both mounted on a base bar 74. A bevel engaging portion 76 is provided at the base of the respective ribs 68 and 70 above the base bar 74. The bevel engaging portion 76 of a preferred embodiment is at substantially the same angle as the bevel 48b of the mounting openings in the baffle panel. The bevel engaging portion 76 is seated at the bevel 48b of the mounting opening 48 in the baffle panel when attached therein.

The base bar 74 of the clip 66 is elongated and extends beyond the longitudinal extent of the ribs 68 and 70 in both directions. The base 74 includes mounting pegs 78 at opposite ends of the base bar 74. Each mounting peg 78 has a catch nose 80 on the outward facing surface for fastening into an opening, such as an opening in a printed circuit board assemble or other mounting location.

Figure 11:
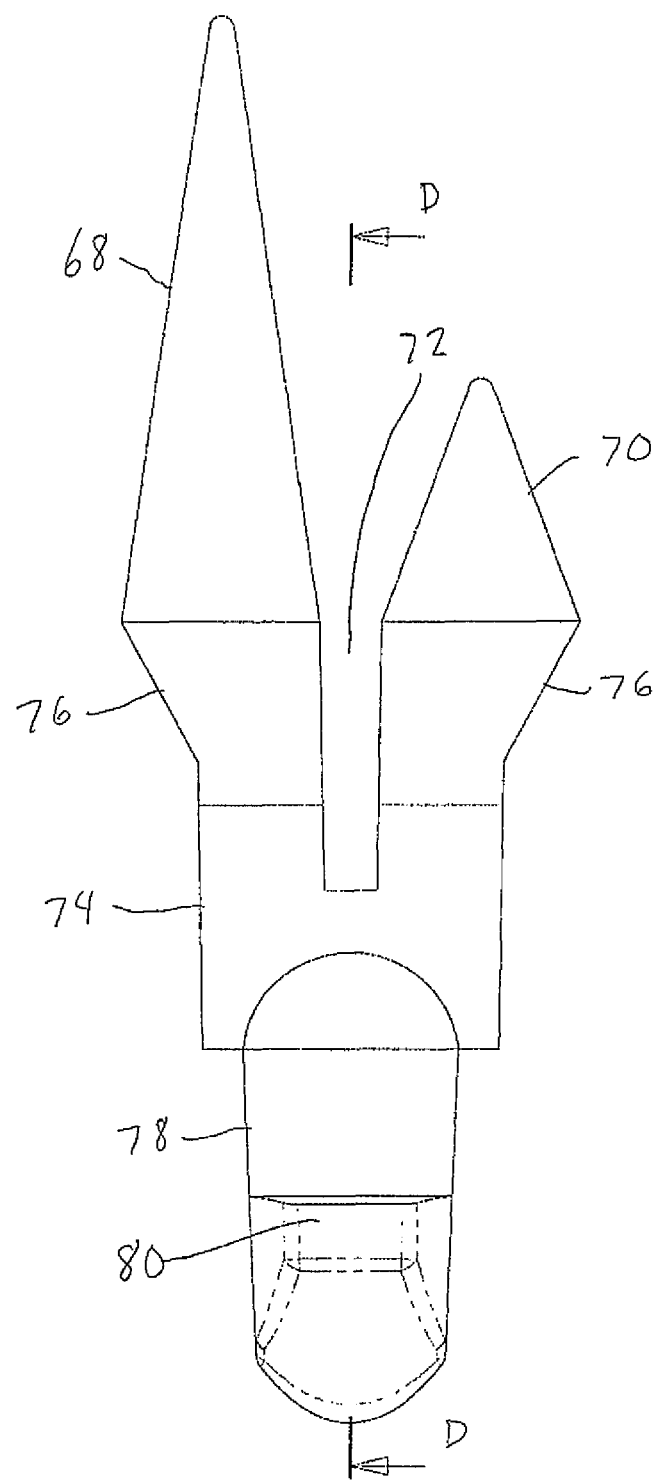
FIG. 11 is an end elevational view of the clip of FIG. 10.

In FIG. 11, the slot 72 between the tall 68 and short ribs 70 extends into the base bar 74 so as to permit the ribs 68 and 70 to flex relative to one another during fastening of the baffle panel 40 to the clip 66 and during removal of the baffle panel 40 from the clip 66. For example, ribs 68 and 70 can flex inwardly relative to one another during insertion of the ribs 68 and 70 into mounting locations 92 (FIG. 14) and bias outwardly relative to one another after insertion through the mounting locations 92 to fasten the baffle panel 40 to the clip 66. The mounting peg 78 extends below the base bar 74 and is tapered from a rounded narrower free end to a wider base. The outwardly angled bevel engaging surfaces 76 on the outer surfaces of the ribs 68 and 70 where the ribs join the base bar 74 are apparent in this view. The upper portions of the tall and short ribs 68 and 70 of the clip are of the same size, shape and configuration as the ribs 46 on the baffle panel 40 into which the clip 66 is to be fastened.

Figure 12:
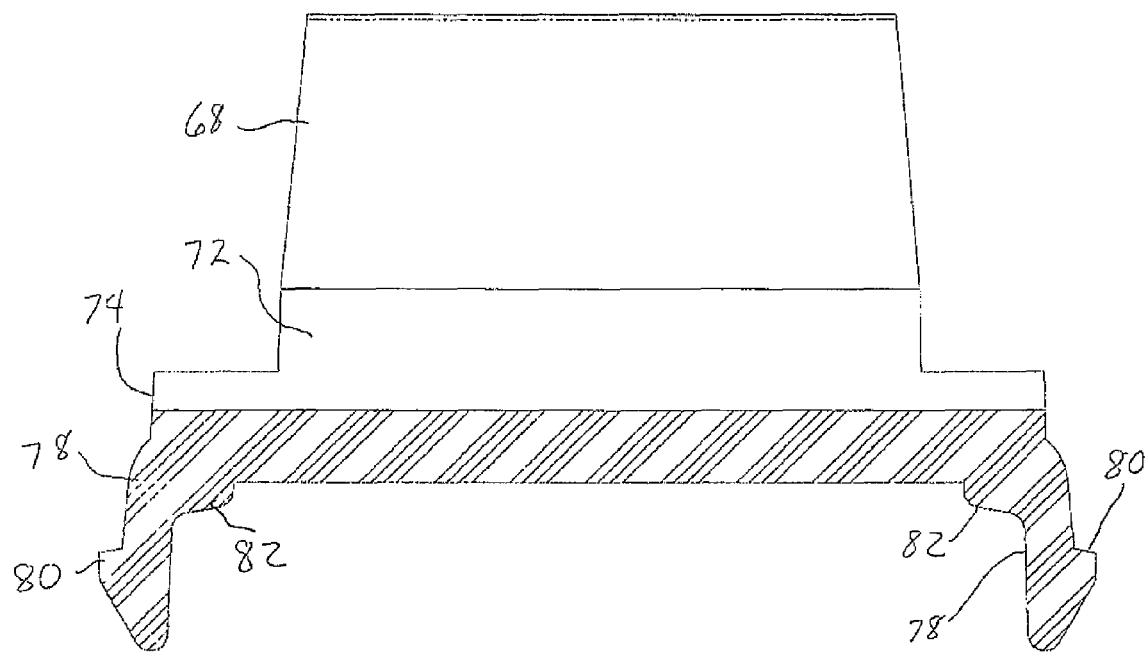
FIG. 12 is a cross sectional view of the clip of FIG. 11 along line D-D.

FIG. 12 shows the mounting pegs 78 extending from the base bar 74 and including the catch nose 80 on the outwardly directed surfaces of the pegs 78. The mounting pegs 78 are provided with a reinforcing portion 82 between the base bar 74 and the peg body 78. The rib 68 in this view is of the same shape as the ribs 46 on the baffle panel 40 into which the clip 66 is to be fastened, tapering from a wider base to a narrower free end. The base bar 74 extends longitudinally beyond the rib 68 to prevent the clip 66 from passing entirely through the mounting opening 48 in the baffle panel and to seat the clip 66 onto the back of the panel 40 when fastened thereon.

Figure 13:
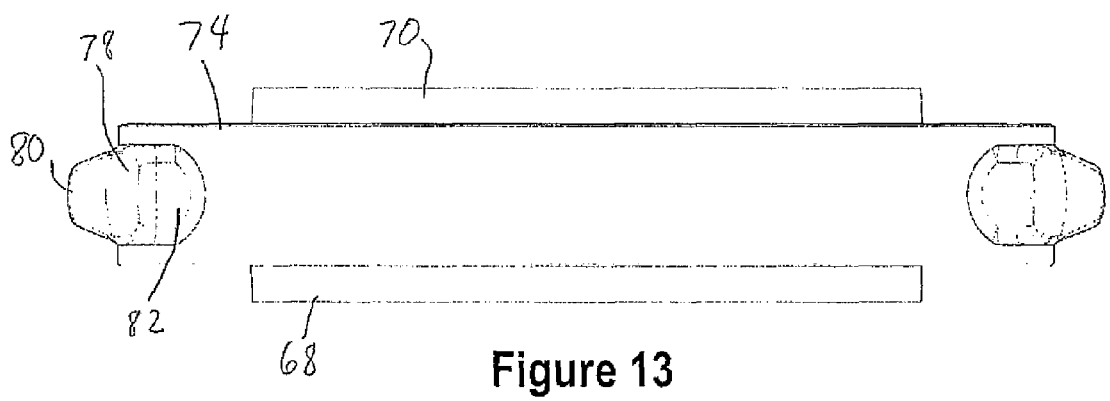
FIG. 13 is a bottom plan view of the clip of FIG. 10.

In FIG. 13, the base bar 74 is narrower than the ribs 68 and 70 but the base 74 extends over a greater extent in the longitudinal direction of the ribs. The pegs 78 and the reinforcing portion 82 at the lower surface of the base 74 are seen. The catch nose 80 of each peg 78 extends outward from the opposing ends of the base bar 74.

Figure 14:
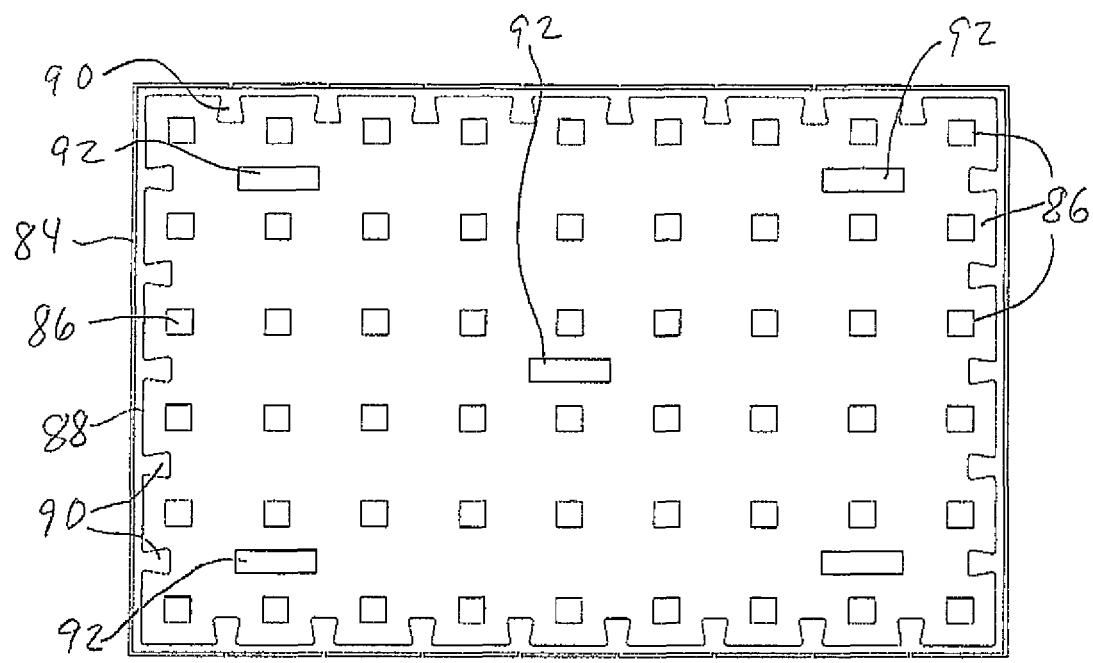
FIG. 14 is a top plan view of a printed circuit board assembly with an array of LEDs.

FIG. 14 shows the printed circuit board assembly or LED panel 84 on which the light baffle panel 40 of FIG. 1 is to be mounted. The printed circuit board assembly 84 includes an array of LED elements or chips 86. Electrical connections (not shown) are provided to the LED elements 86 to provide power and control to the LEDs for operation of the LEDs as light emitting elements of the video display. A frame 88 is provided on the LED panel 84 that includes inwardly extending portions 90 projecting into the interior space of the LED panel 84 between LED rows and columns. Mounting locations 92 are provided on the LED panel 84 at which the mounting clips 66 are to be fastened. Five such mounting locations 92 are provided in the same position as the mounting openings 48 of the baffle panel 40. The illustrated mounting locations 92 may include openings through the panel 84 for attaching clips for example by the pegs 78 extending through openings in the panel 84 or may indicate mounting positions at which the clips 66 are affixed. Other mounting means may be provided within the scope of this invention. Each of the mounting locations is of an elongated rectangular shape 92. Other arrangements and numbers of mounting openings may of course be provided.

Figure 15:
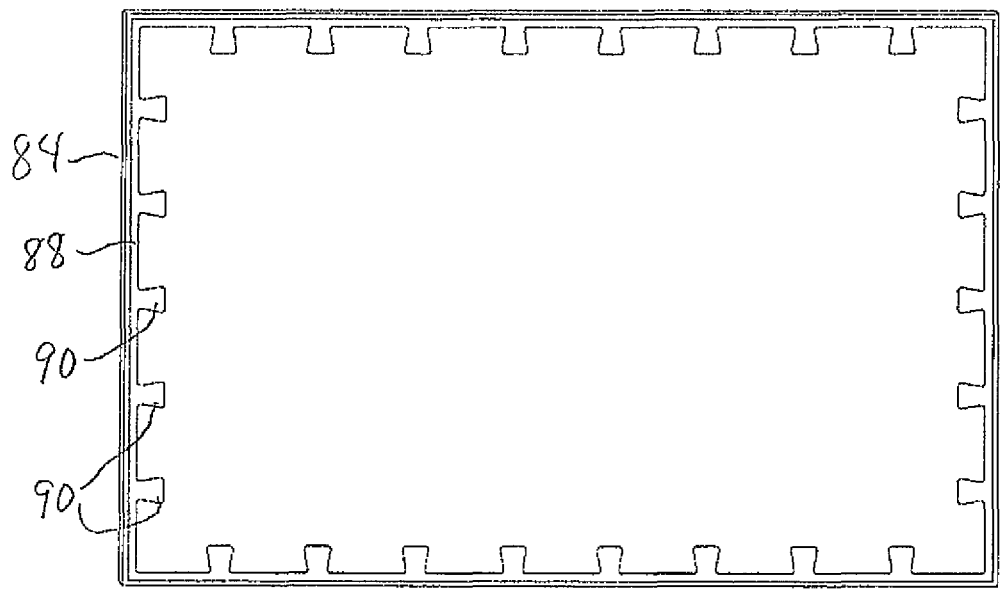
FIG. 15 is a top plan view of the printed circuit board assembly of FIG. 14 without the LED array.

FIG. 15 shows the LED panel 84 without the LED chips and without the mounting openings or mounting locations. The frame 88 with the inwardly extending portions 90 is shown. The frame 88 and inwardly extending portions 90 are formed by a double injection layer that is slightly larger than the plastic louver. The frame is of TPE (thermoplastic elastomer). The frame is preferably slightly larger than the louver portion so that any gap between adjacent louver panels, such as a gap that may result from the draft angle of plastic injection or otherwise, is closed when the louver panels are attached to the printed circuit boards.

Figure 16:
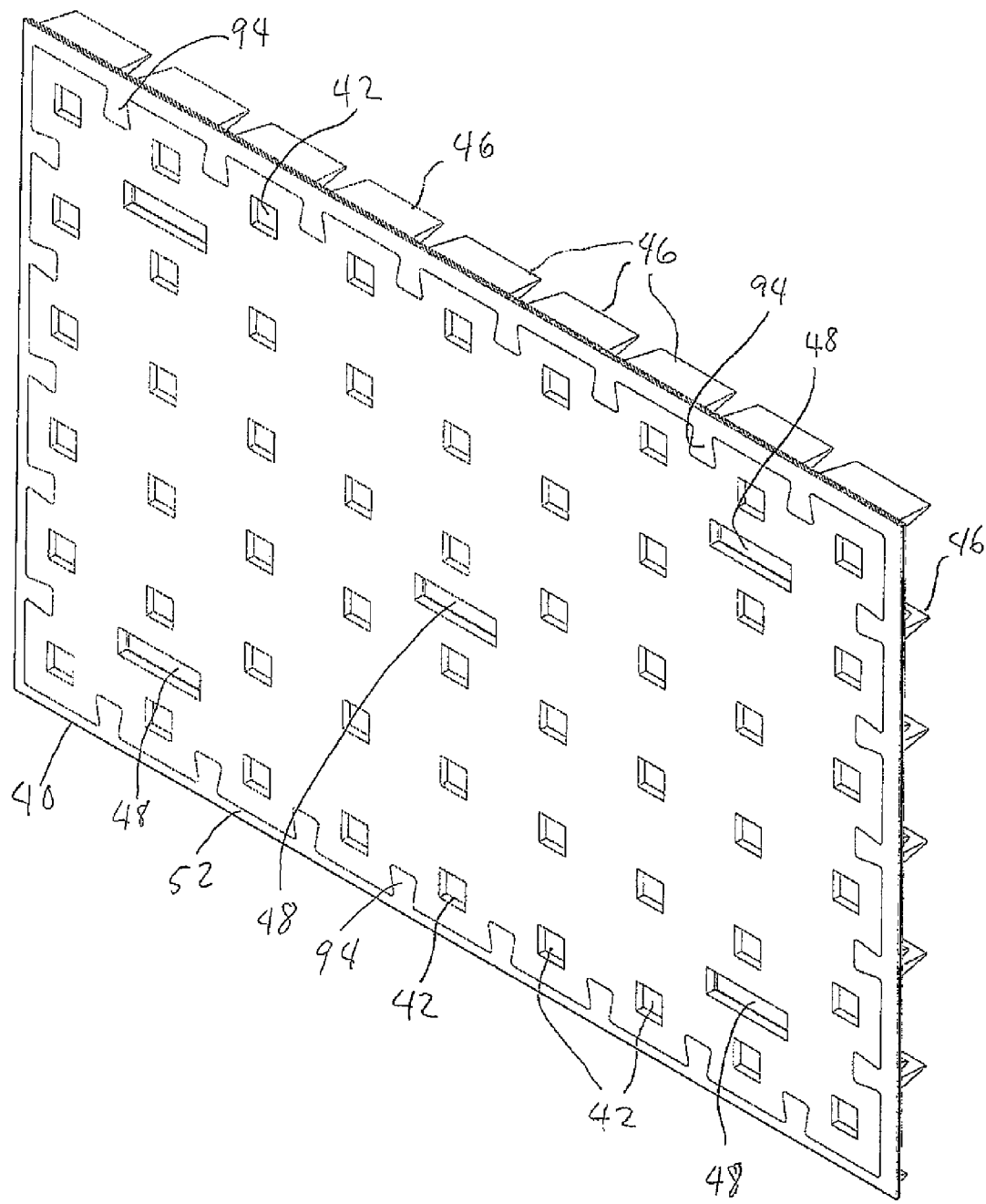
FIG. 16 is a back perspective view of the light baffle of FIG. 1 for mounting on the circuit board assembly of FIG. 14.

FIG. 16 shows a back view of the baffle panel 40 of FIG. 1. The arrangement of ribs or shaders 46 extending from the front of the baffle panel 40 is seen, along with the LED openings 42. Five mounting openings 48 are provided extending through the baffle panel 40. The frame 52 extends about the perimeter of the panel 40. Inwardly extending portions 94 are provided in the frame 52. The inwardly extending portions 94 are of a similar shape to the inwardly extending portions 90 of the frame 88. Each is narrower at the base and wider at the free end so as to securely engage the panel in which this are provided.

Figure 17:
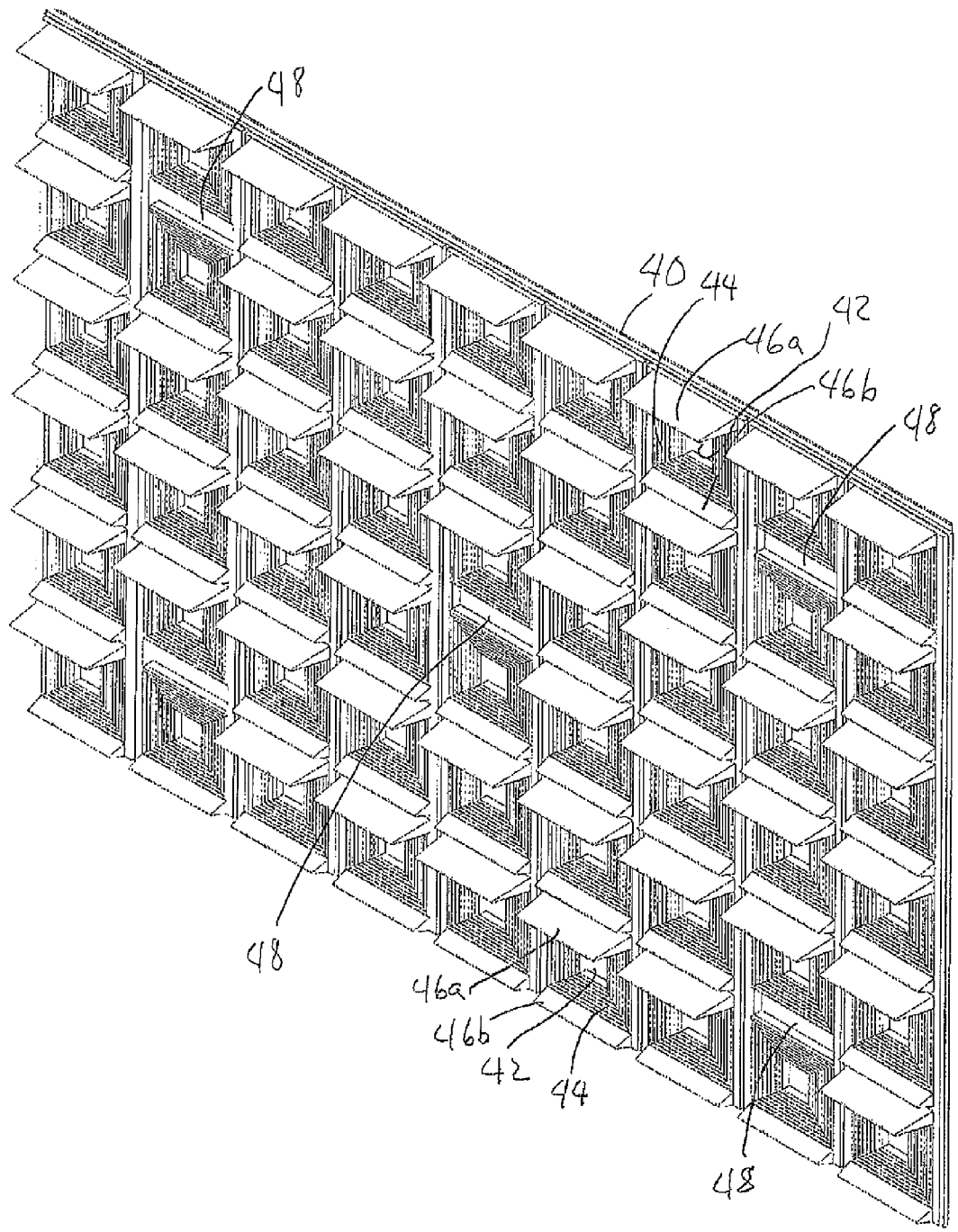
FIG. 17 is a front perspective view of the light baffle of FIG. 1.

In FIG. 17, the baffle panel 40 includes the taller ribs or shaders 46a above each LED opening 42 and associated reflector structure 44 except where the five mounting openings 48 are located. The shorter ribs 46b are provided below each LED opening 42 and associated reflector structure 44, also except for the ribs that would be located where each mounting opening 48 is located.

Fastening of the LED panel 84 and baffle panel 40 to one another is shown in FIGS. 35 through 39, which are described following the description of a second embodiment.

Figure 18:
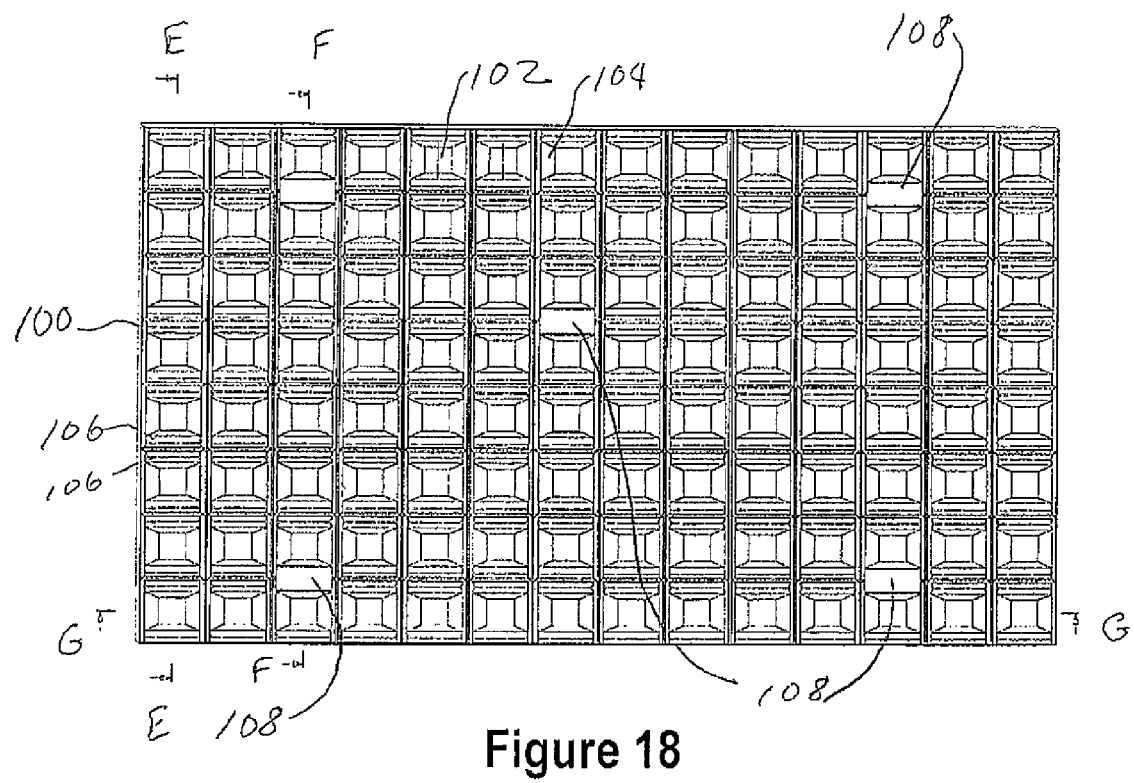
FIG. 18 is a top plan view of a second embodiment of a light baffle for an LED light array.
Figure 19:
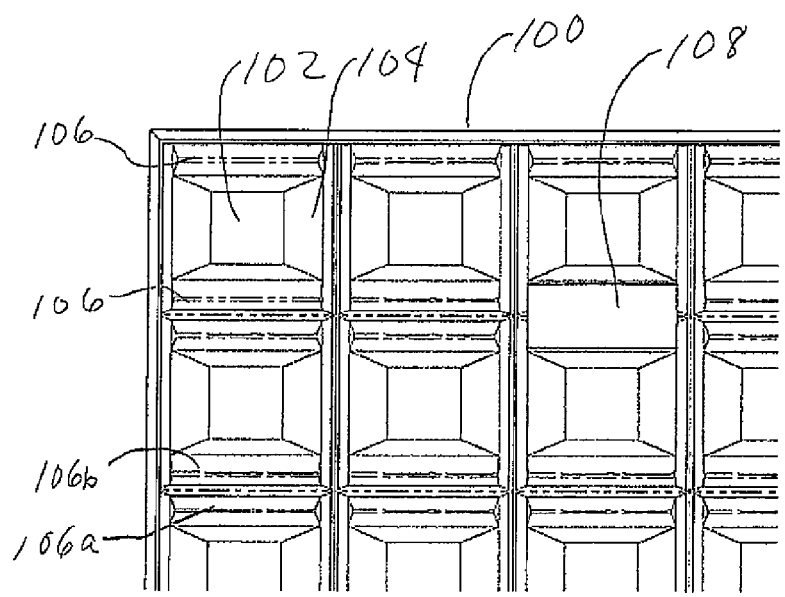
FIG. 19 is an enlarged view of a corner of the light baffle of FIG. 18.

FIGS. 18 and 19 show a second embodiment of a light baffle panel 100. The openings 102 for each LED element are adjoined by a reflector structure 104 that has smooth surfaces rather than the ridges of the first embodiment. The reflector 104 is also proportioned somewhat differently with a greater extent of the reflector surface in the direction parallel to the light diverting ribs or shaders 106 and a lesser extent of the reflector structure in a direction perpendicular to the ribs 106. A tall rib 106a is provided above each LED reflector element 104 and a short rib 106b is provided below each reflector element 104, so that pair of a short rib and tall rib is between adjacent LED reflector elements 104 in a vertical direction. The illustrated baffle panel is provided for a 14 by 8 array of LED elements.

Five mounting openings 108 are formed into the baffle panel 100. The mounting openings 108 extend through the panel 100 where paired ribs would appear in the regular arrangement of ribs.

Figure 20:
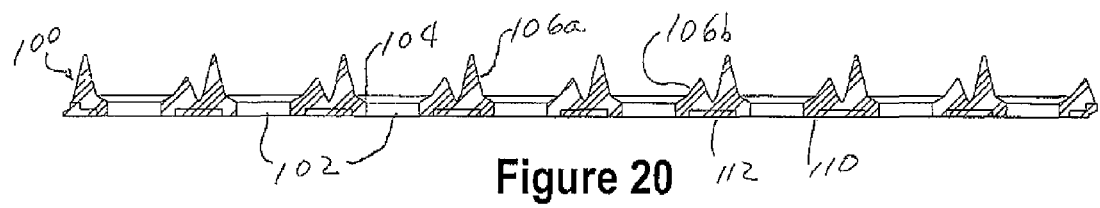
FIG. 20 is a cross sectional view of the light baffle of FIG. 18 along line E-E.
Figure 21:
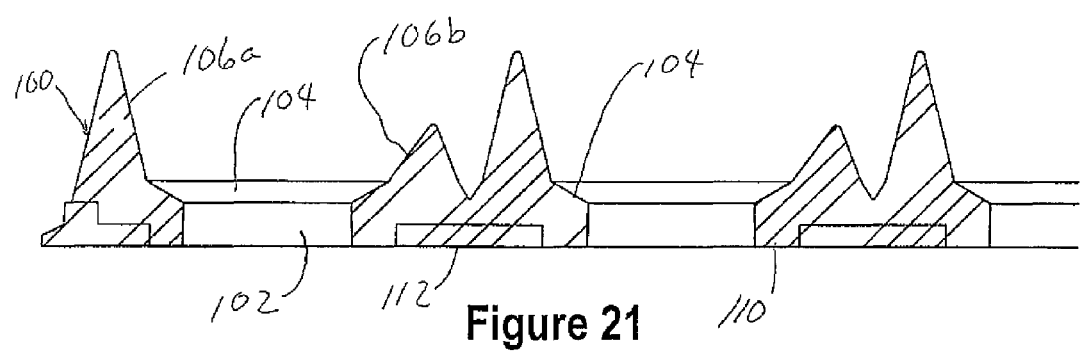
FIG. 21 is an enlarged view of the end of the light baffle of FIG. 20.

FIGS. 20 and 21 show the paired tall and short ribs 106a and 106b of adjacent LED reflectors elements 104. A tall rib or shader 106a is provided above the LED opening 102 and reflector structure 104 and a short rib 106b is provided below the LED opening 102 and reflector structure 104. The reflector 104 surrounding each LED opening 102 is smooth and disposed at an angle to the back 110 of the baffle panel. Light from the LED is reflected off the smooth reflector surface 104. A base element or frame element 112 is provided fastened into a recess in the panel 100 below each rib pair 106. The LED reflectors 104 may be provided with smooth surfaces as shown in this embodiment, with the undulating or ridged structure of the first embodiment, or with other structures and shapes as desired.

Figure 22:
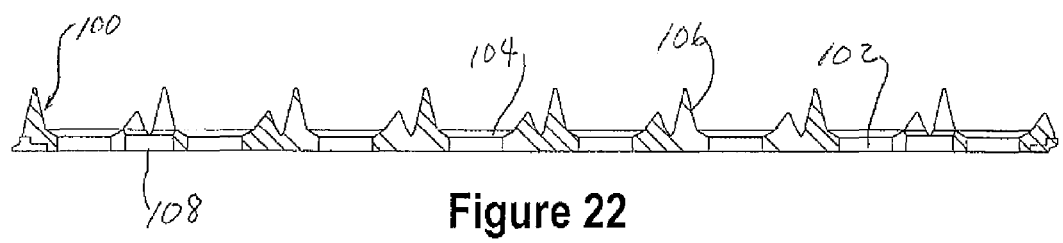
FIG. 22 is a cross sectional view of the light baffle of FIG. 18 along line F-F.
Figure 23:
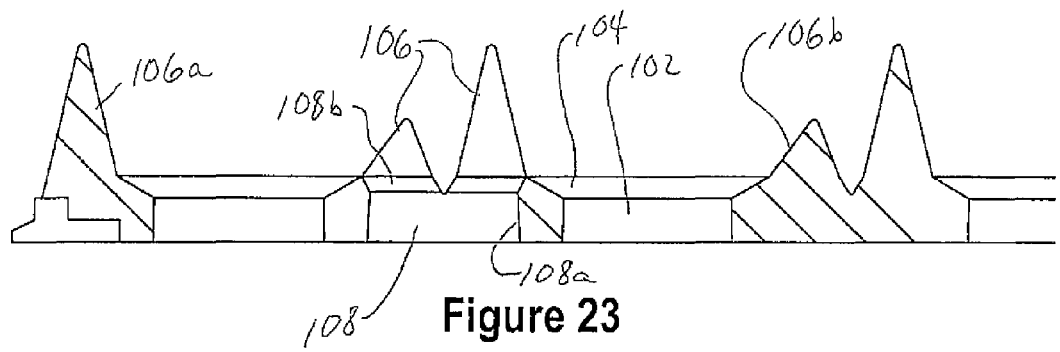
FIG. 23 is an enlarged view of the cross section of FIG. 22.

FIGS. 22 and 23 show the mounting openings 108 for receiving mounting clips. The openings 108 are disposed where the paired ribs 106 would otherwise be located in the regular pattern of ribs. The mounting openings 108 are slightly flared, at 108a, to be wider toward at the back surface 110 of the baffle panel and are provided with a beveled opening portion 108b at the front surface of the baffle panel. Where the mounting openings 108 are shown in this view, the ribs 106 of the next reflector element pair are visible in end view.

Figure 24:
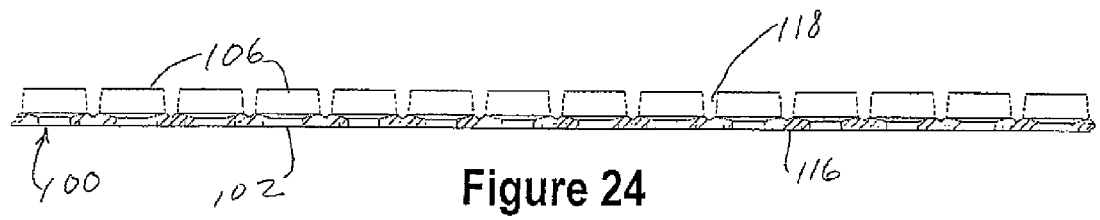
FIG. 24 is a cross sectional view of the light baffle of FIG. 18 along line G-G.
Figure 25:
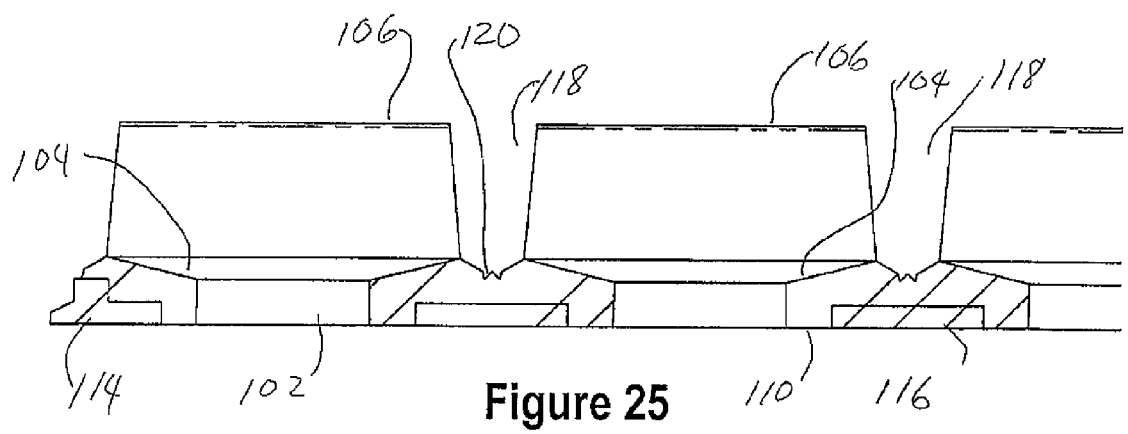
FIG. 25 is an enlarged view of the end of the cross section of FIG. 24.

FIG. 24 and the enlarged view of FIG. 25 show the side view of the row of ribs or shaders 106. The ribs 106 are centered on the LED openings 102 and extend the width of the reflector structures 104. The reflector structures 104 have a greater extent in the horizontal direction (parallel to the ribs) than in the vertical direction (perpendicular to the ribs) shown in FIGS. 20-23. The reflector elements 104 have smooth, angled surfaces for reflecting the light emitted from the LEDs. A frame 114 is provided at the outer edges of the baffle panel 100, and includes frame portions 116 fit into the back of the panel. A recess is formed between each LED opening and a reinforcing portion or frame portion 116 is fit into the recess. The baffle panel 100 may be formed onto the frame 114 and reinforcing portion 116 such as by molding the baffle panel 100 to the frame 114, or may be formed in other ways in the various embodiments of the invention.

Figure 26:
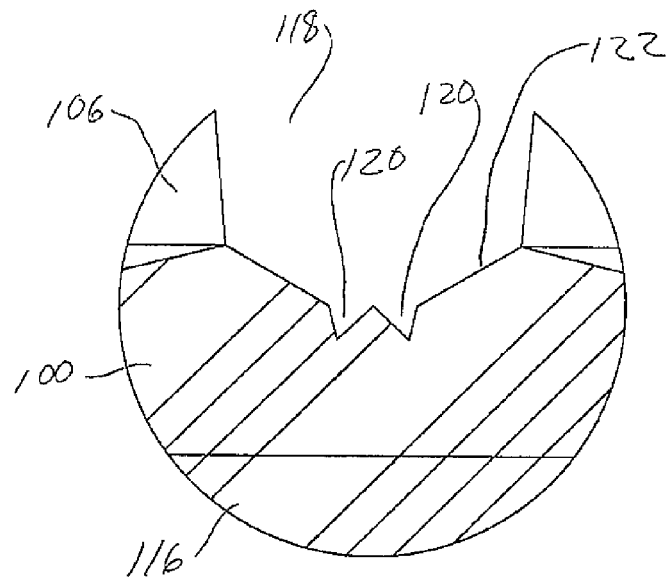
FIG. 26 is an enlarged fragmentary view of the light baffle of FIG. 25.

As seen in FIG. 26, a gap 118 between adjacent ribs 106 is provided with a pair of V-shaped channels 120. The V-shaped channels 120 are disposed tilted at an angle to one another and are formed into a surface 122 of the baffle panel 100 that angles downward toward the back 110 of the panel from the base of each rib 106. Like the notch 60, the channels 120 appear between each light element and have an appearance similar to a seam between adjoining light panels. The result is that the seam between panels is indistinguishable. or at least nearly so, from the channels 120 so that the seams are not apparent to the viewer.

Figure 27:
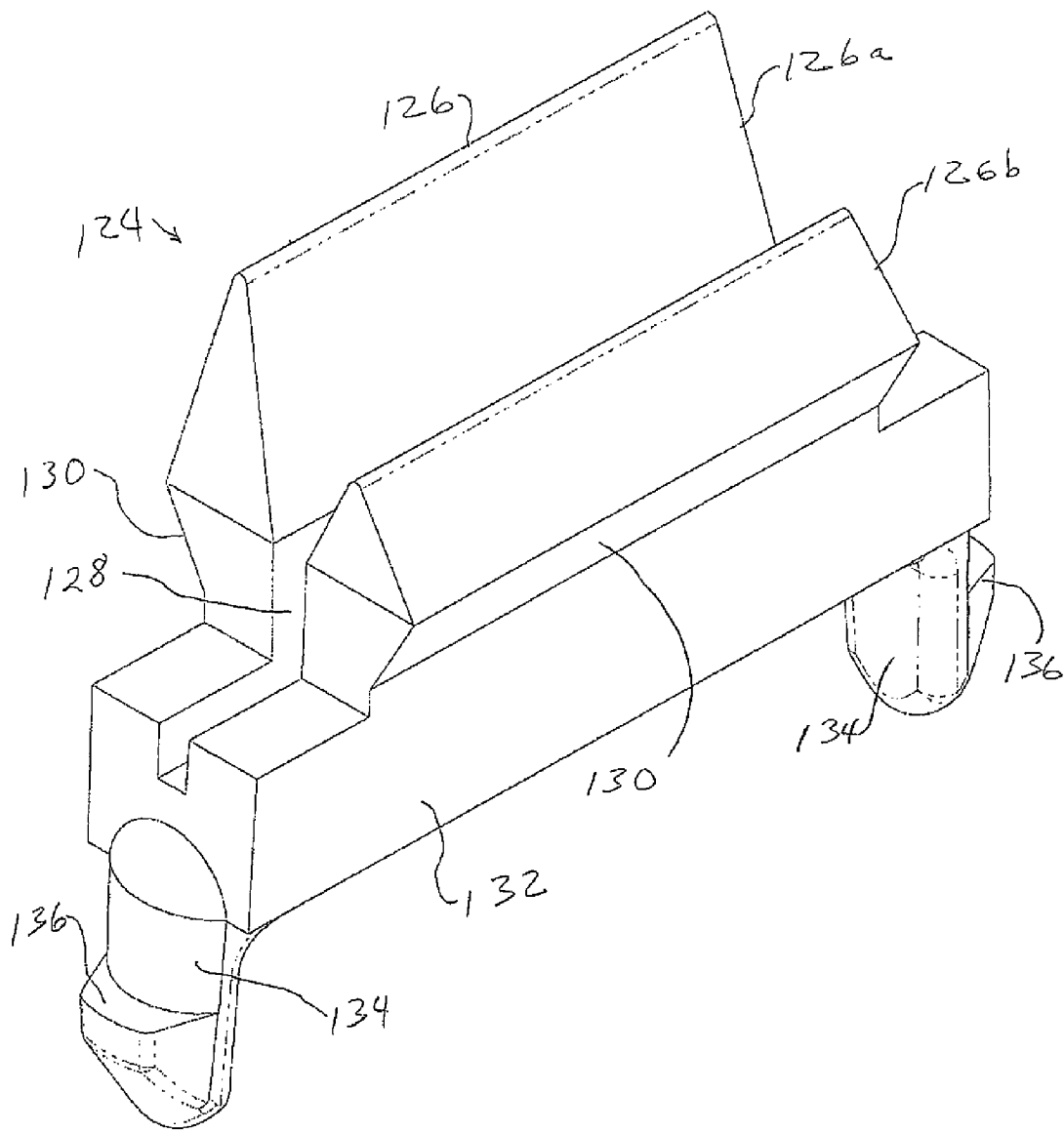
FIG. 27 is a perspective view of a second embodiment of a clip for fastening a light baffle to a printed circuit board assembly.

FIG. 27 shows a second embodiment of a mounting clip 124. The mounting clip 124 includes a pair of ribs 126, including a short rib 126b and a tall rib 126a. A slot 128 is formed between the ribs 126, a beveled outer mounting surface 130 is provided at the base of the ribs 126, and a base bar 132 extends beyond the longitudinal extent of the ribs 106. Mounting pegs 134 are provided at the ends of the base bar 132 with a catch nose 136 at the outwardly facing surfaces of the respective peg 134.

Figure 28:
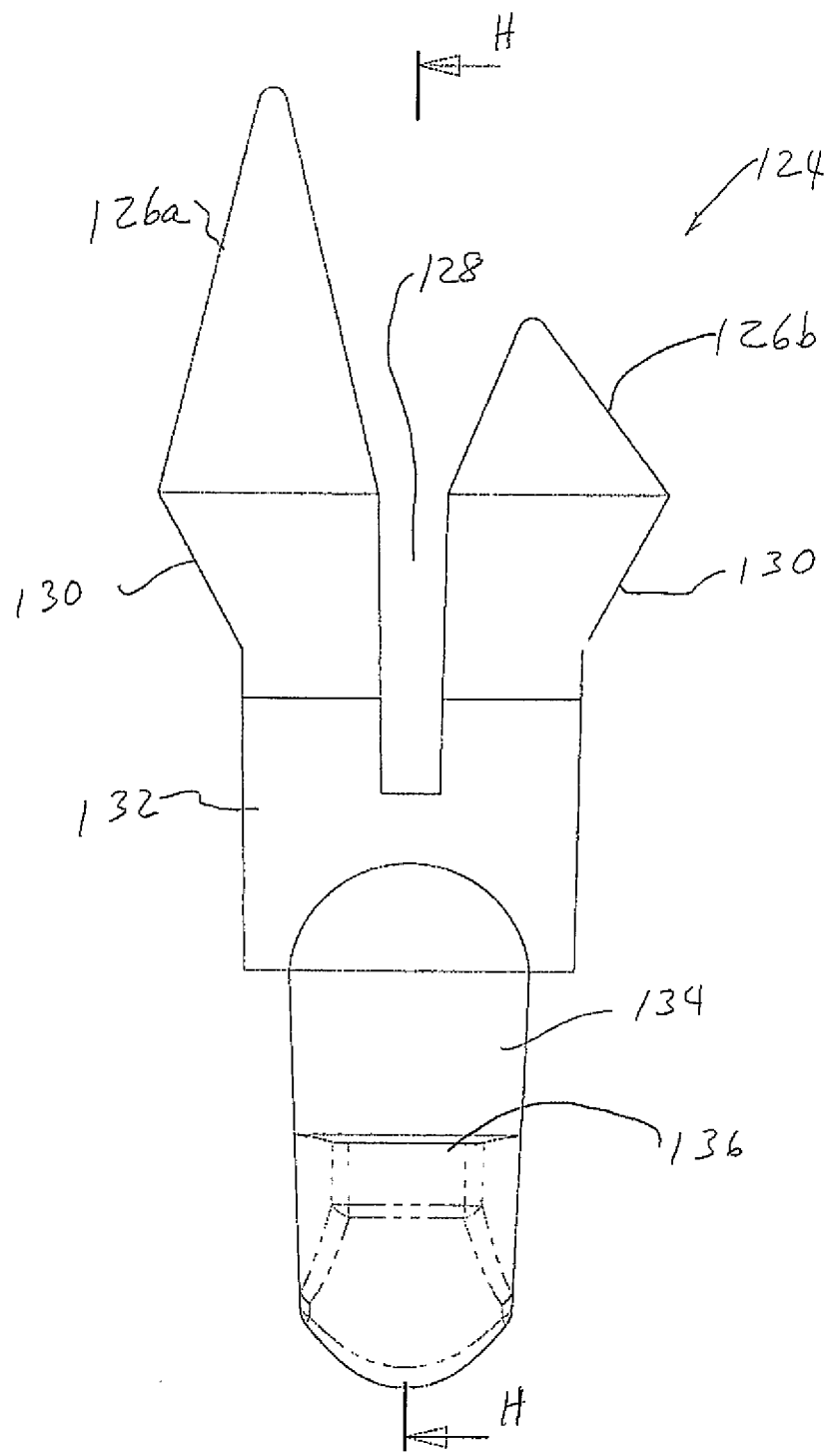
FIG. 28 is an end elevational view of the clip of FIG. 27.

In the end view of FIG. 28, the mounting clip 124 is shaped with the same dimensions and shape of ribs 126 as the baffle panel 100 into which the clip will be affixed. The slot 128 extends into the base bar 132 sufficiently to permit flexing of the ribs 126 during mounting and unmounting. For example, ribs 126a and 126b can flex inwardly relative to one another during insertion of the ribs 126a and 126b into mounting openings 108 (FIG. 34) and bias outwardly relative to one another after insertion through the mounting openings 108 to fasten the baffle panel 100 to the clip 124. The beveled mounting surfaces 130 at the base of the ribs 126 provides the fastening force to hold the mounting clip 124 in place in the mounting opening 108 of the baffle panel 100. For example, as the ribs 126a and 126b bias outwardly relative to one another, the beveled mounting surfaces 130 of the ribs 126 engage corresponding beveled surfaces of the mounting openings 108 (as similarly discussed above with reference to FIG. 10).

Figure 29:
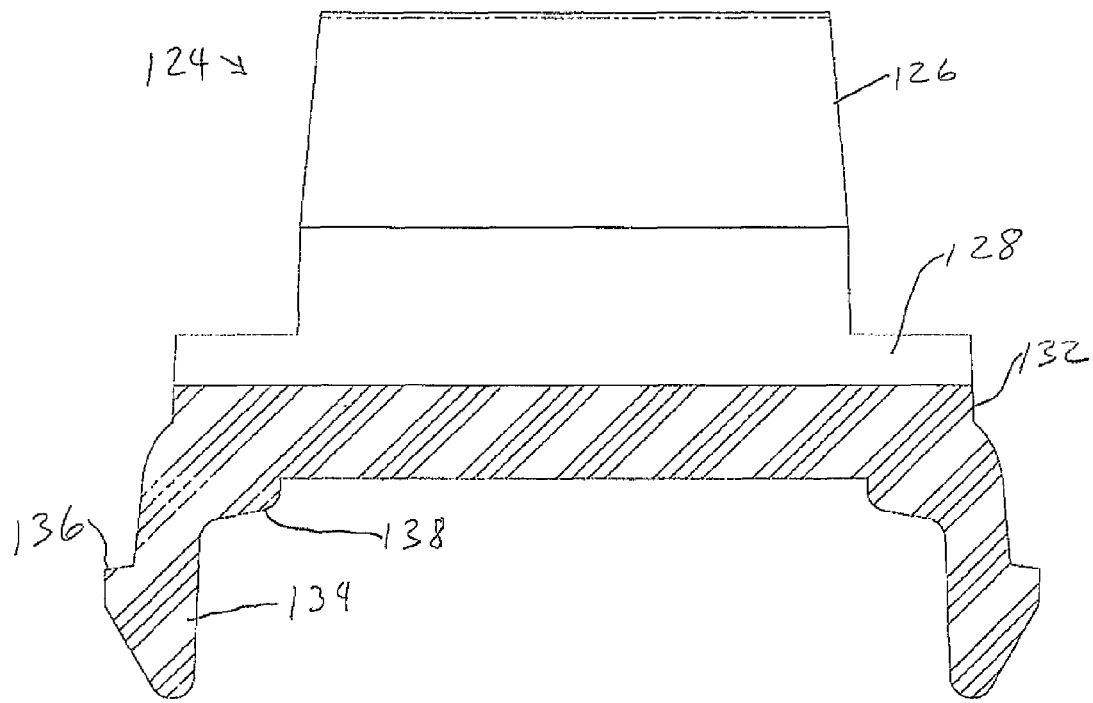
FIG. 29 is a cross sectional view of the clip of FIG. 28 along line H-H.
Figure 30:
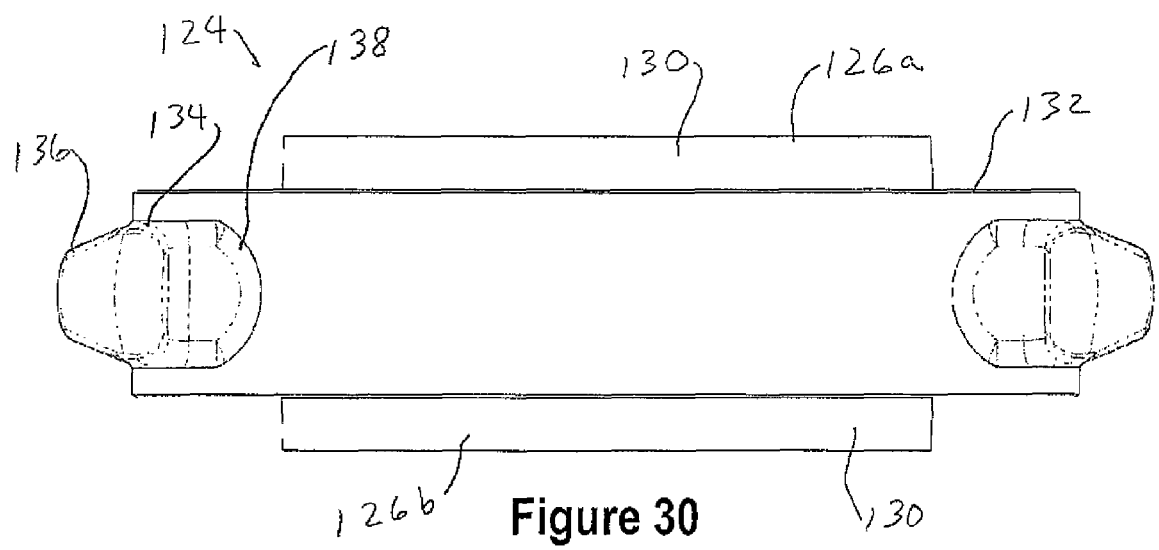
FIG. 30 is a bottom plan view of the clip of FIG. 27.

FIGS. 29 and 30 show the shape of the base bar 132, mounting pegs 134 and ribs 126 which are similar in some respects to the first embodiment but dimensioned to work with the baffle 100 of the second embodiment. The mounting pegs 134 each have a reinforcing portion 138 connecting the base bar 132 to the mounting peg 134.

Figure 31:
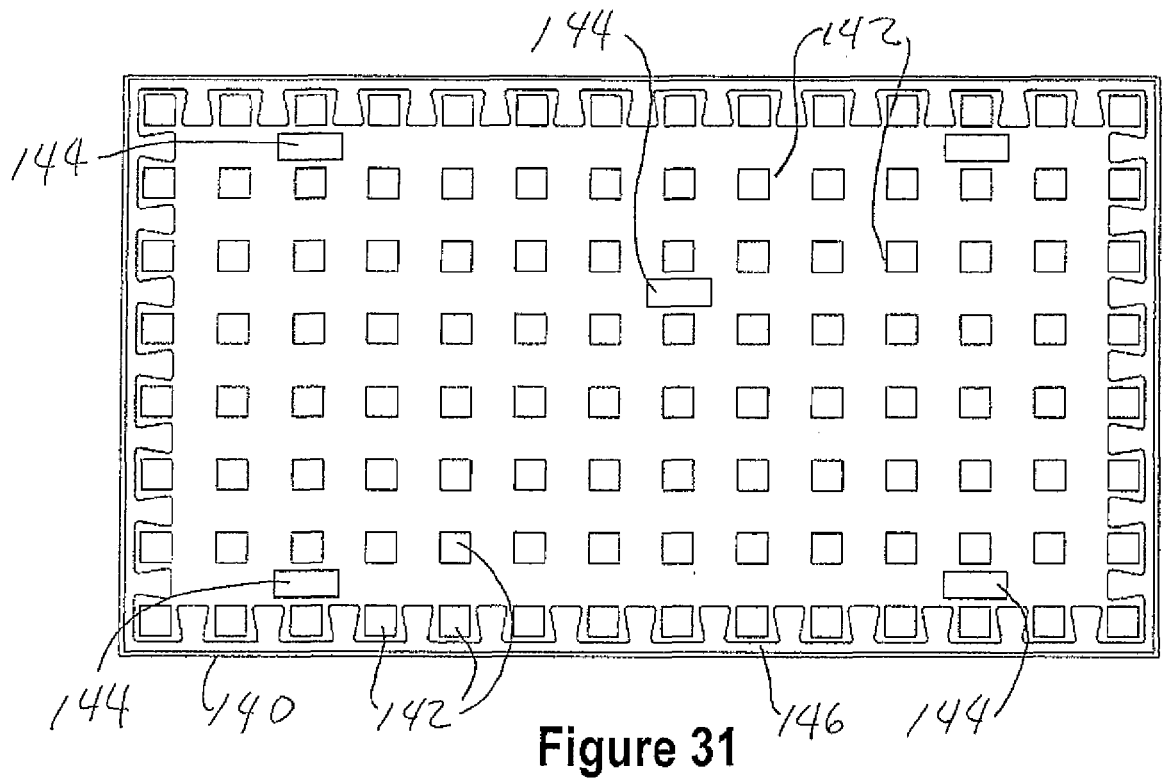
FIG. 31 is a top plan view of a printed circuit board assembly of a second embodiment including an array of LEDs.
Figure 32:
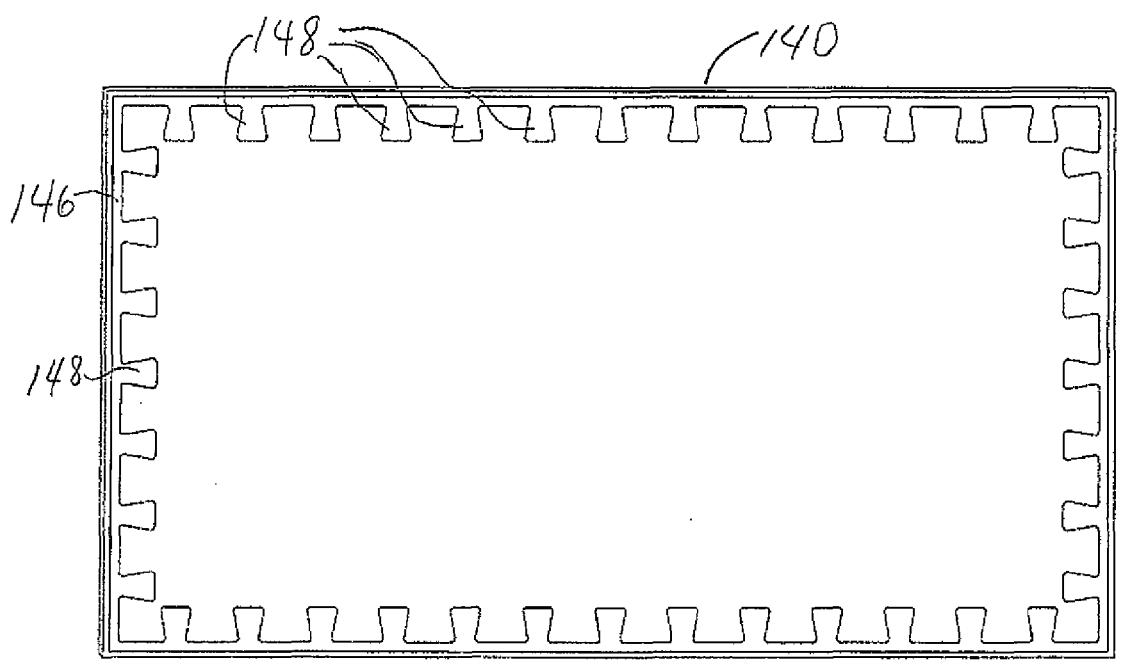
FIG. 32 is a top plan view of the printed circuit board assembly of FIG. 31 without the LEDs.

FIG. 31 shows an arrangement of LED elements 142 on an LED panel 140 disposed in an array that matches the openings in the baffle 100 of the second embodiment. The LED panel 140 has five mounting openings 144 at which the mounting clips 124 will be mounted. The mounting openings 144 may be openings into the LED panel or may be mounting locations on the panel, or other attachment means. A frame 146 has inwardly extending portions 148 between LED elements 142 that border the panel 140. The frame 146 and inwardly extending portions 148 are seen in FIG. 32.

Figure 33:
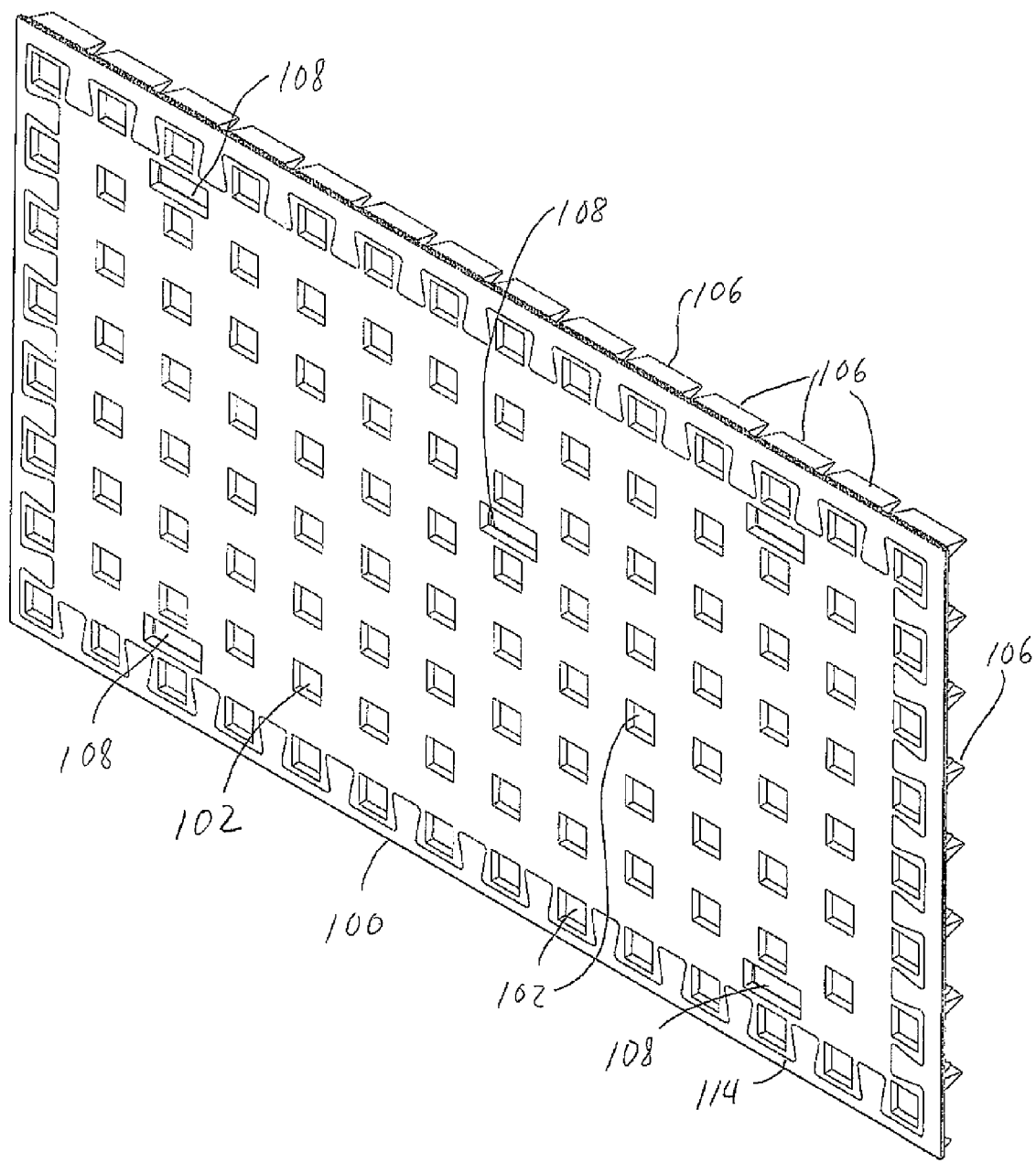
FIG. 33 is a back perspective view of the light baffle of FIG. 18 for mounting on the printed circuit board assembly of FIG. 31.

The light baffle 100 of the second embodiment is shown in FIG. 33. The mounting openings 108 are provided in the positioned discussed above. The ribs or shaders 106 extend from the front of the baffle panel 100. The baffle panel 100 has a frame 114 with inwardly extending portions 112 between the LED openings 102 that border the panel, similar to the frame of the LED panel.

Figure 34:
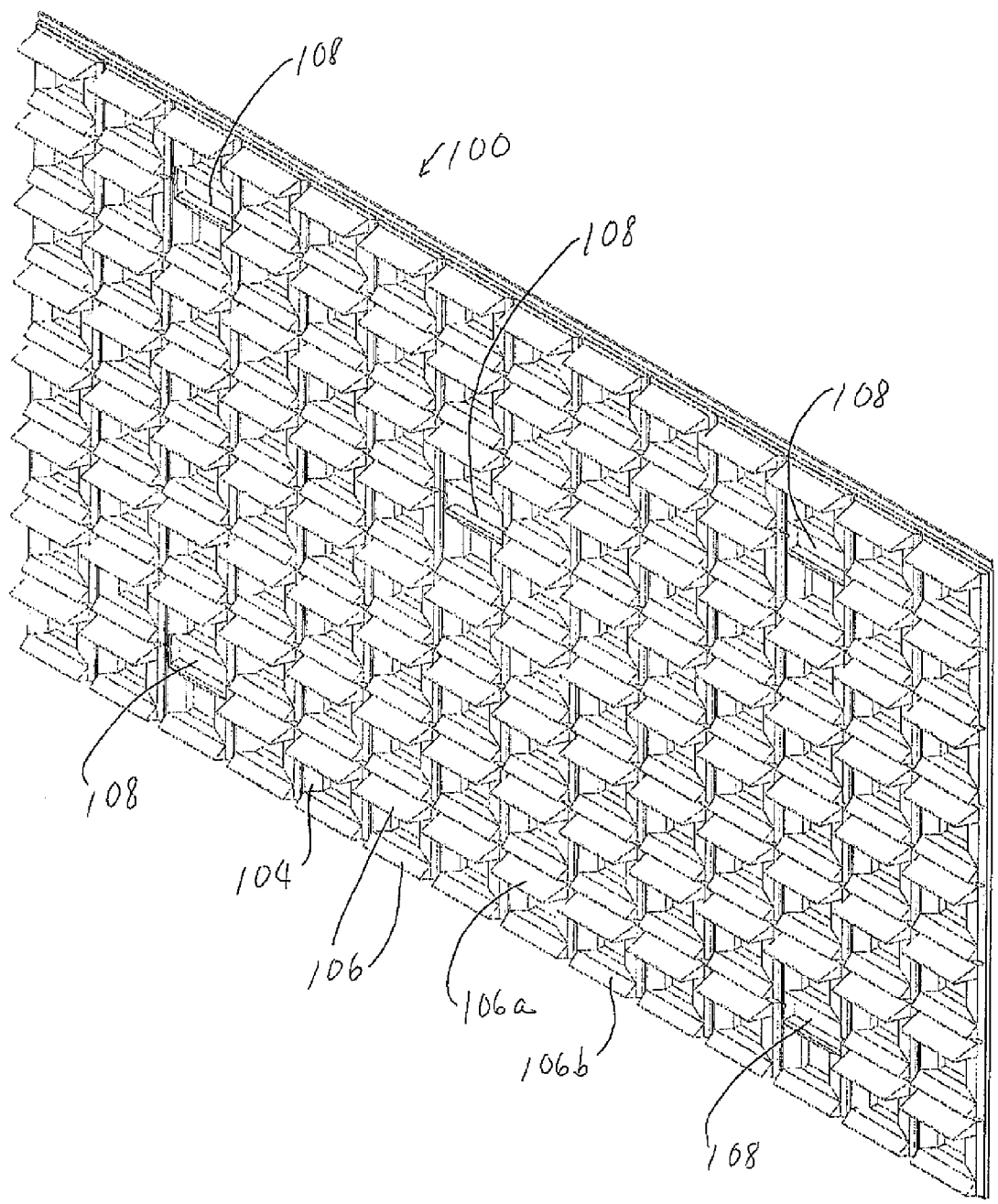
FIG. 34 is a front perspective view of the light baffle of FIG. 33.

In FIG. 34 the baffle panel 100 includes the arrangement of ribs 106 and reflectors 104 but with paired ribs missing where the mounting openings 108 are provided.

Figure 35:
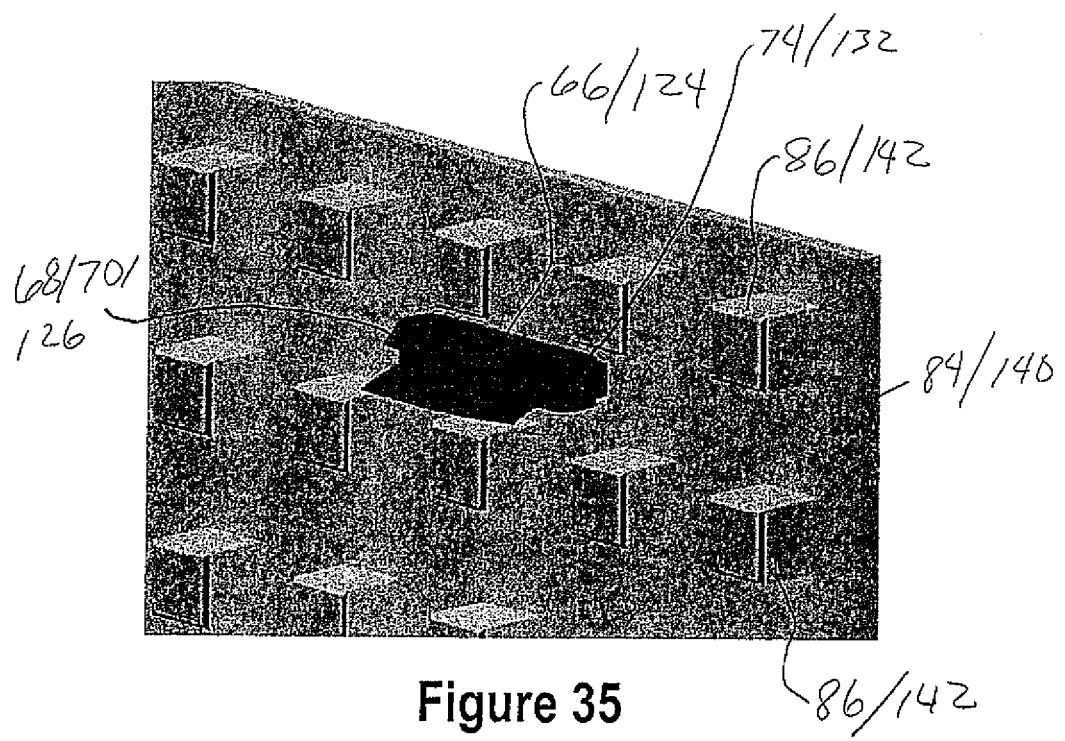
FIG. 35 is an enlarged front perspective view of a portion of another embodiment of a LED panel.

FIG. 35 shows the LED elements 86/142 arranged in an array on a printed circuit board assembly or other LED mounting panel 84/140. A mounting clip 66/124 according to the first or second embodiments is affixed to the LED panel. The mounting clip 66/124 is affixed with the base bar 74/132 at the surface of the LED panel and the rib pair 68/70/126 extending outwardly therefrom. In the preferred embodiment, the printed circuit board assembly is formed to mount SMD (surface mounted device) LED elements on a front side of the circuit board with conductors and through connectors that accommodate LED drive electronics, such as a driver IC (integrated circuit), power and data connectors and the like on the rear side of the printed circuit board. The plastic clips are mounted on the front side of the printed circuit board so that the louver panel can be snapped onto the clips to form a screen portion that is arranged adjacent other such screen portions to form the whole display screen.

Figure 36:
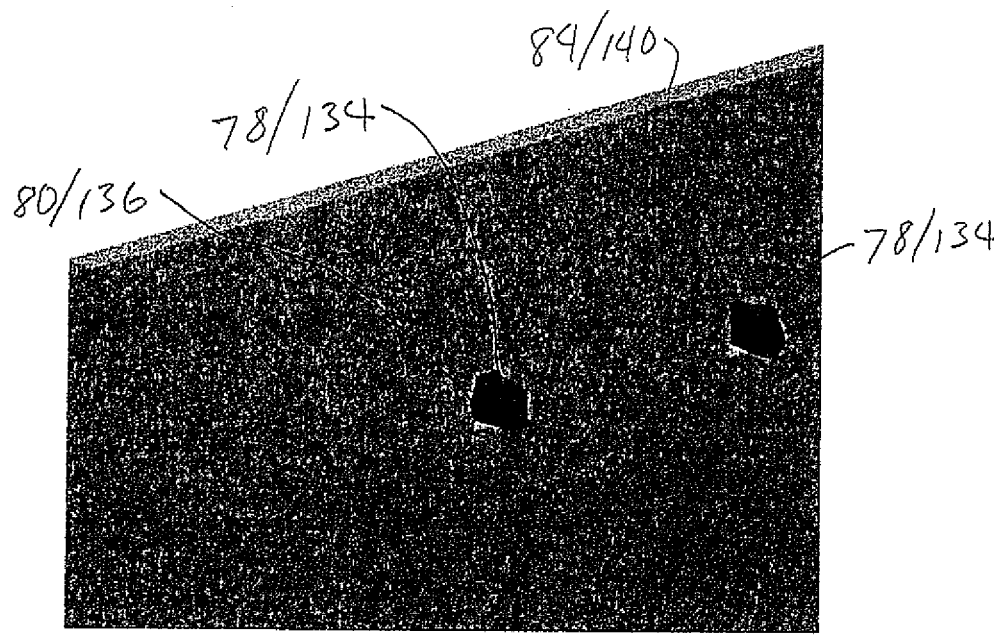
FIG. 36 is a back view of the portion of the LED panel of FIG. 35.

FIG. 36 shows a back view of the LED panel 84/140 of FIG. 35. The mounting pegs 78/134 of the mounting clip 66/124 extend through the LED panel and the catch noses 80/136 of the pegs engage the back surface of the panel. The mounting clip is thereby fastened to the LED panel. The openings through which the mounting pegs extend may be small openings sufficient to pass each mounting peg as shown in FIG. 36 or may be elongated openings through which both mounting pegs extend. Other means for mounting the mounting clips to the LED panel may be provided within the scope of this invention.

Figure 37:
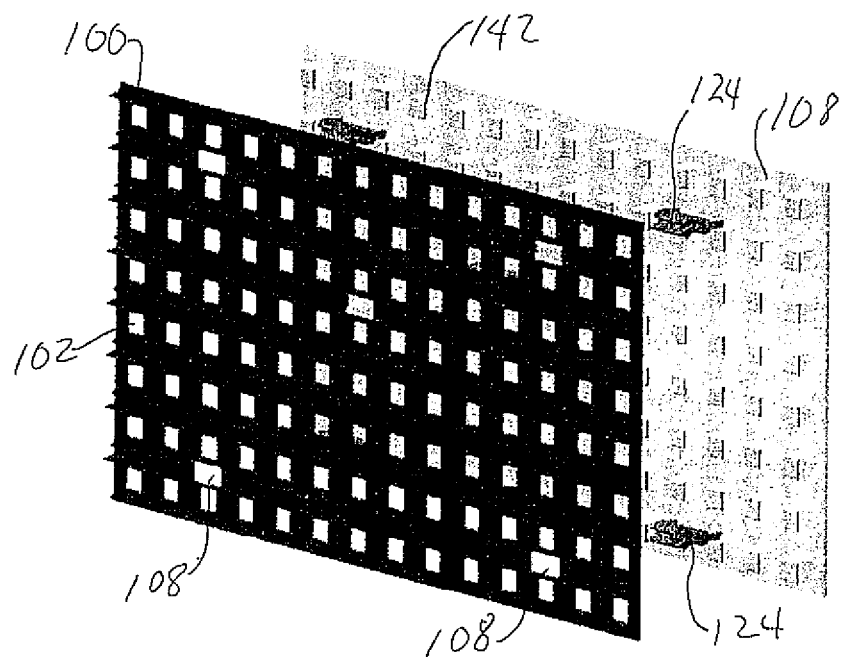
FIG. 37 is a front perspective view of the second embodiment of the LED panel with the second embodiment of the baffle panel shown disposed in position for fastening to the LED panel.

FIG. 37 shows the LED panel 140 of the second embodiment on which five of the mounting clips 124 have been mounted. The baffle panel 100 is shown disposed in position for fastening to the LED panel 140, with the mounting openings 108 aligned opposite respective mounting clips 124 and with LED openings 102 aligned opposite respective LED elements 142. The principles of this illustration apply to both embodiments of the baffle and LED panel described herein as well as other embodiments within the scope of the invention.

Figure 38:
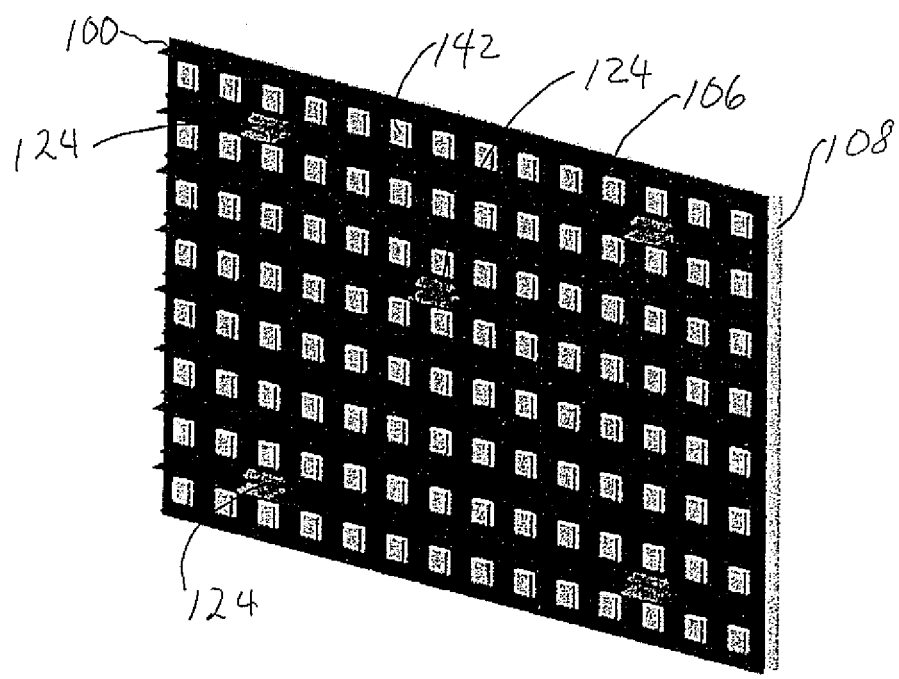
FIG. 38 is a front perspective view of the baffle panel shown in FIG. 37 fastened onto the LED panel shown in FIG. 37.

FIG. 38 shows the baffle panel 100 fastened onto the LED panel 108 by inserting the LED elements 142 through the respective openings in the baffle panel 100 and by inserting the mounting clips 124 through the respective mounting openings in the baffle panel 100. The mounting clips 124 are shown with contrasting shading for purposes of illustration. In the actual baffle panel, the mounting clip ribs are formed to be indistinguishable from the ribs or shaders 106 of the baffle panel 100.

Figure 39:
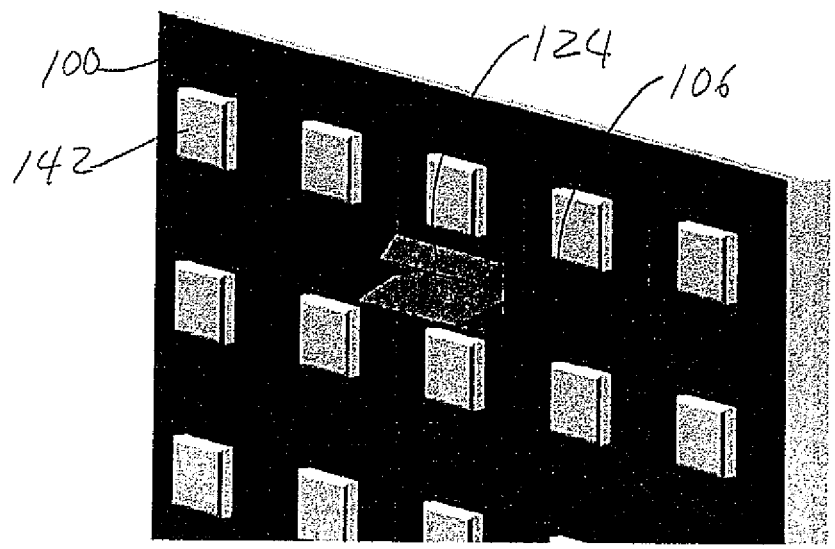
FIG. 39 is an enlarged front perspective view of FIG. 38.

FIG. 39 shows a portion of the baffle panel 100 with a mounting clip 124 fastened into place at the mounting opening. The ribs 126 of the mounting clip align 124 with the ribs 106 in the baffle panel 100 and are of the same shape, size, color, coating, and the like so as to be indistinguishable from the ribs 106 of the baffle panel 100 to the viewer. In some embodiments, an indication may be provided on the ribs 126 of the clip to permit a repair person to distinguish the ribs of the clip. For example, a texture or mark may be provided.

Thus, there is shown and described an LED panel with light baffle that may be used as a portion of a larger video display. The light deflecting ribs or shaders of the baffle are replaced with ribs or shaders of mounting clips to secure the LED panel to the baffle without apparent mounting structure being visible to the viewer.

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, although various lamps have been illustrated, the present invention can be applied to the construction of other configurations of an LED lighting fixture. This specification is intended to cover any adaptations or variations of the specific embodiments discussed herein. Therefore, it is intended that this invention be limited only by the claims and the equivalents thereof.

Furthermore, although other modifications and changes may be suggested by those skilled in the art, it is the intention of the inventors to embody within the patent warranted hereon all changes and modifications as reasonably and properly come within the scope of their contribution to the art.

What is claimed is:

1. An LED video panel, comprising:
at least one LED panel including a plurality of LED elements;
a light baffle panel defining a plurality of LED openings for receiving the LED elements of the at least one LED panel, the light baffle panel including:
reflectors at the LED openings,
at least one light deflecting rib at the reflectors,
the light baffle panel defining a plurality of mounting openings; and
a plurality of mounting clips each including a first portion affixed to the at least one LED panel and a second portion including a pair of light deflecting ribs, the pair of light deflecting ribs being configured to extend through a respective one of the mounting openings of the light baffle panel and to bias outwardly from one another to fasten the light baffle panel to the LED panel.

2. The LED video panel as claimed in claim 1, wherein the light baffle panel includes a pair of ribs disposed between adjacent ones of the reflectors.

3. The LED video panel as claimed in claim 2, wherein the pair of ribs of the light baffle panel includes a tall rib and a short rib disposed adjacent to and in parallel to one another.

4. The LED video panel as claimed in claim 3, wherein the respective pairs of light deflecting ribs of the mounting clips each include a tall rib and a short rib, the respective pairs of light deflecting ribs matching the pair of ribs of the light baffle panel when the mounting clips are fastened in the mounting openings of the light baffle panel.

5. The LED video panel as claimed in claim 2, wherein the mounting clips each define a slot formed between respective pairs of light deflecting ribs to permit the pairs of light deflecting ribs to flex toward one another during insertion into the mounting opening in the light baffle panel.

6. The LED video panel as claimed in claim 1, wherein each of the mounting clips each include a base bar and at least one mounting peg extending from the base bar, the at least one mounting peg being fastened to the LED panel.

7. The LED video panel as claimed in claim 6, wherein the base bar of each mounting clip includes two mounting pegs, the mounting pegs each including a catch nose for engagement with the LED panel.

8. The LED video panel as claimed in claim 1, wherein the LED panel includes an array of LED elements disposed in rows and columns,
wherein the light baffle panel includes the LED openings, the reflectors, and light deflecting ribs at the reflectors arranged in an array of rows and columns, the at least one light deflecting ribs being included in the light deflecting ribs at the reflectors;
wherein the mounting openings in the light baffle panel are disposed in place of selected ones of the light deflecting ribs in the rows and columns of light deflecting ribs; and
wherein the plurality of mounting clips are disposed in place of the selected light deflecting ribs when mounted in the mounting openings of the light baffle panel.

9. The LED video panel as claimed in claim 8, wherein the rows of light deflecting ribs at the reflectors include rows of rib pairs; and wherein the mounting clips are disposed in place of the selected rib pairs in the rows of rib pairs.

10. The LED video panel as claimed in claim 1, wherein each of the mounting openings in the light baffle panel includes a beveled outer portion of the mounting openings; and wherein each of the pairs of light deflecting ribs of the mounting clips include beveled mounting portions disposed at the beveled outer portion of each of the mounting openings when the mounting clips are fastened in the mounting openings.

11. The LED video panel as claimed in claim 1, wherein the reflectors include a plurality of ridged surfaces arranged about respective ones of the LED openings in the light baffle panel.

12. The LED video panel as claimed in claim 1, wherein the reflectors include a plurality of smooth surfaces arranged about respective ones of the LED openings in the light baffle panel.

13. The LED video panel as claimed in claim 1, wherein the pair of light deflecting ribs are configured to bias outwardly from each other following insertion into the respective one of the mounting openings to fasten the light baffle panel to the LED panel.

14. A method of mounting a light baffle to an LED panel, comprising:

fastening a mounting clip to an LED panel having a plurality of LED elements disposed in an array, the mounting clip including a pair of light deflecting ribs extending perpendicular to the LED panel; and inserting the pair of light deflecting ribs of the mounting clip through a mounting opening in a light baffle, the light baffle including LED openings disposed to receive the plurality of LED elements of the LED panel, the light baffle including a plurality of light deflecting ribs in a regular arrangement, the pair of light deflecting ribs of the mounting clip being configured to bias outwardly from one another following insertion through the mounting opening, and being positioned in the regular arrangement of the light deflecting ribs of the light baffle when the mounting clip is fastened in the mounting opening of the light baffle.

15. The method as claimed in claim 14, wherein the inserting the pair of light deflecting ribs of the mounting clip through the mounting opening includes seating a beveled portion of each rib of the pair of ribs of the mounting clip at respective beveled portions of the mounting opening of the light baffle.

16. The method as claimed in claim 15, wherein the pair of light deflecting ribs of the mounting clip are configured to bias the beveled portion of each rib of the pair of light deflecting ribs towards the respective beveled portions of the mounting opening.

17. The method as claimed in claim 14, wherein the inserting the pair of light deflecting ribs through the mounting opening includes flexing the ribs of the pair of ribs toward one another during the insertion of the pair of light deflecting ribs.

18. The method as claimed in claim 14, wherein the fastening the mounting clip to the LED panel includes inserting at least one mounting peg of the mounting clip into a mounting opening in the LED panel.

19. A video display, comprising:

a light emitting element panel;

a plurality of light emitting elements disposed in an array on the light emitting element panel;

a plurality of clips affixed to the light emitting element panel, each of the clips including a base mounted to the light emitting element panel and pair of light directing ribs extending from the base, the light directing ribs being affixed to the base so as to flex toward one another and configured to bias outward from one another, the ribs each having a beveled lower outer surface;

a light baffle defining an array of openings for receiving the array of the light emitting elements, reflector structures formed in the light baffle at each of the openings for receiving the light emitting elements, first and second light deflecting ribs disposed on opposite sides of the reflector structures, ones of the light deflecting ribs forming pairs of light deflecting ribs between adjacent reflector structures, the light baffle defining a plurality of mounting openings through the light baffle, the mounting openings including beveled portions of the mounting openings;

wherein the pair of light deflecting ribs of the mounting clips extends through respective ones of the mounting openings in the light baffle, the beveled lower outer surfaces of the ribs being biased towards, and disposed at, the beveled portions of the mounting openings, so that the light baffle is affixed to the light emitting element panel by the mounting clips.

\* \* \* \* \*